(12) United States Patent
Tuli et al.

(10) Patent No.: US 7,538,355 B1
(45) Date of Patent: May 26, 2009

(54) LASER ADDRESSED MONOLITHIC DISPLAY

(76) Inventors: Raja Singh Tuli, 555 Rene Levesque, Suite 1130, Montreal, Quebec (CA) H2Z 1B1; Ricardo Izquierdo, 555 Rene Levesque, Suite 1130, Montreal, Quebec (CA) H2Z 1B1

( * ) Notice: Subject to any disclaimer, the term of this patent is extended or adjusted under 35 U.S.C. 154(b) by 0 days.

(21) Appl. No.: 10/716,796

(22) Filed: Nov. 20, 2003

(51) Int. Cl.
*H01L 27/15* (2006.01)
*H01S 3/00* (2006.01)

(52) U.S. Cl. .................................. 257/85; 359/343
(58) Field of Classification Search ............... 257/12, 257/13, 21, 22, 40, 80, 81–85, 94, 96, 97, 257/103, E31.096, E31.097; 359/342–344
See application file for complete search history.

(56) References Cited

U.S. PATENT DOCUMENTS

| | | | |
|---|---|---|---|
| 4,093,852 A | 6/1978 | Olive et al. | |
| 4,338,387 A | 7/1982 | Hewitt | |
| 4,562,461 A | 12/1985 | Yin | |
| 4,714,956 A | 12/1987 | Yin | |
| 4,885,211 A | 12/1989 | Tang | |
| 5,059,862 A | 10/1991 | VanSlyke et al. | |
| 5,463,468 A | 10/1995 | Takanashi et al. | |
| 5,684,307 A | 11/1997 | Ishumira | |
| 5,838,025 A | 11/1998 | Lealman | |
| 6,037,718 A * | 3/2000 | Nagami | 315/169.3 |
| 6,191,764 B1 * | 2/2001 | Kono et al. | 345/76 |
| 6,475,648 B1 | 11/2002 | Hatwar et al. | |
| 7,079,307 B2 * | 7/2006 | Chun Liu et al. | 359/326 |
| 2002/0043927 A1 * | 4/2002 | Kimura | 313/504 |
| 2002/0125818 A1 * | 9/2002 | Sato et al. | 313/504 |
| 2003/0025458 A1 | 2/2003 | Tuli | |
| 2003/0102809 A1 | 6/2003 | Tuli | |
| 2004/0089860 A1 * | 5/2004 | Edamura et al. | 257/10 |
| 2004/0151887 A1 * | 8/2004 | Forrest et al. | 428/212 |
| 2004/0262614 A1 * | 12/2004 | Hack et al. | 257/79 |

(Continued)

FOREIGN PATENT DOCUMENTS

EP     1353312 A1    10/2003

(Continued)

OTHER PUBLICATIONS

Nakayama K et al, Charge-injection controlled organic transistor, Applied Physics letters, 2003, vol. 82, No. 25, p. 4584.

(Continued)

*Primary Examiner*—David S Blum

(57) ABSTRACT

The present invention aims to provide a display screen where pixels are addressed by a scanning LASER. The screen performs as a photo-amplifier circuit, producing light output at the region being illuminated by the LASER. This illumination produces electron-hole pairs forming two small currents, one of which subsequently results in a much larger electron or hole current from a specific region of the photo-amplifier. This larger current reaches an emitting region where recombination with other electrons or holes produces light. The duration of the light output is increased up to a frame period or more by increasing the duration of the larger current using various materials having properties that prolong recombination of electrons and holes in a specific device region. In another instance, a feedback effect is utilized by using the incident output light, which may be filtered, replacing the scanning LASER that has left the pixel.

36 Claims, 21 Drawing Sheets for NPN DEVICE for PNP DEVICE

U.S. PATENT DOCUMENTS

2005/0040392 A1* 2/2005 Wu et al. ............... 257/40

FOREIGN PATENT DOCUMENTS

| GB | 2118803 A | 11/1983 |
|---|---|---|
| WO | WO 9012387 | 10/1990 |
| WO | WO 02/39417 A1 | 5/2002 |

OTHER PUBLICATIONS

Nakayama K et al, Photocurrent mutiplication at organic/metal inteface and surface morphology of organic films, Journal of Applied Physics, 2000, vol. 87, No. 7, p. 3365.

Nakayama K et al, A high speed photocurrent mutiplication device based on an organic double-layered structure, Applied Physics Letters, 2000, vol. 76, No. 9, p. 1194.

Nakayama K et al, Direct Tracing of the photocurrent mutiplication process in an organic pigment film, Journal of Applied Physics, 1998, vol. 84, No. 11, p. 6154.

Hiramato M et al, Photocurrent mutiplication in amorphous silicon carbide films, Applied Physics Letters, 1991, vol. 59, No. 16, p. 1992.

Hiramato M et al, Photocurrent mutiplication in organic pigment films, Applied Physics Letters, 1994, vol. 64, No. 2, p. 187.

Hiramato M et al, spatially addressable light transducer . . . , Applied Physics Letters, 1990, vol. 57, No. 16, p. 1625.

Hiramato M et al, Photocurrent mutiplication in organic single crystals, Applied Physics Letters, 2002, vol. 81, No. 8, p. 1500.

Hiramato M et al, Direct measurement of internal potential distribution in organic electroluminescent diodes . . . , Applied Physics Letters, 2000, vol. 76, No. 10, p. 1336.

Hiramato M et al, Field-activated structural traps at organic pigment/metal interfaces causing photocurrent . . . , Applied Physics Letters, 1998, vol 73, No. 18, p. 2627.

Hiramato M et al, Light amplification in a new light transducer combining . . . , Optical Review, 1994, vol. 1, No. 1, p. 82.

Hiramato M et al, Photocurrent multiplication phenomena at organic/metal and organic/organic interfaces, Thin Solid Films, 1998, No. 331, p. 71-75.

Katsume T et al, Photocurrent multiplication in napthalene tetracarboxylic anhydride film at room temprature, Applied Physics Letters, 1996, vol. 69, No. 24, p. 3722.

Tano T et al, Observation of photoassisted electroluminescent . . . , Extended Abstracts 2001 International Conferences on Solid State Devices and Materials, Tokyo, p. 638-639.

Ni J et al, Organic light emitting diode with TiOPc layer . . . , Jpn. J. Appl. Phys., 2001, vol. 40, p. L948-L951.

Katsume T et al, Light amplification device using organic electroluminescent diode coupled with photoresponsive . . . , Applied Physics Letters, 1995, vol. 66, No. 22, p. 2992.

Katsume T et al, High photon conversion in a light transducer combining organic electroluminescent diode . . . , Applied Physics Letters, 1994, vol. 64, No. 19, p. 2546.

Chikamatsu M et al, Light up-conversion from near-infrared to blue using a photoresponsive organic light emitting device, Applied Physics Letters, 2002, vol. 81, No. 4, p. 769.

Matsunbo G et al, High-speed multiplication-type photodetecting device using organic codeposited films, Applied Physics Letters, 2002, vol. 81, No. 7, p. 1321.

Murray A. Lampert, Simplified Theory of Space-Charge-Limited Currents in an Insulator with Traps, Physical Review, Sep. 15, 1956, 1648-1656, vol. 103, No. 6.

Burrows P.E. et al., Relationship between electroluminescence and current transport . . . , J. Appl. Phys., 7991-8006, May 15, 1996, 79 (10).

Baldo M.A. et. al., Phosphorescent materials for application to organic light emiting devices, Pure Appll. Chem., 2095-2106, 1999, vol. 71, No. 11.

* cited by examiner

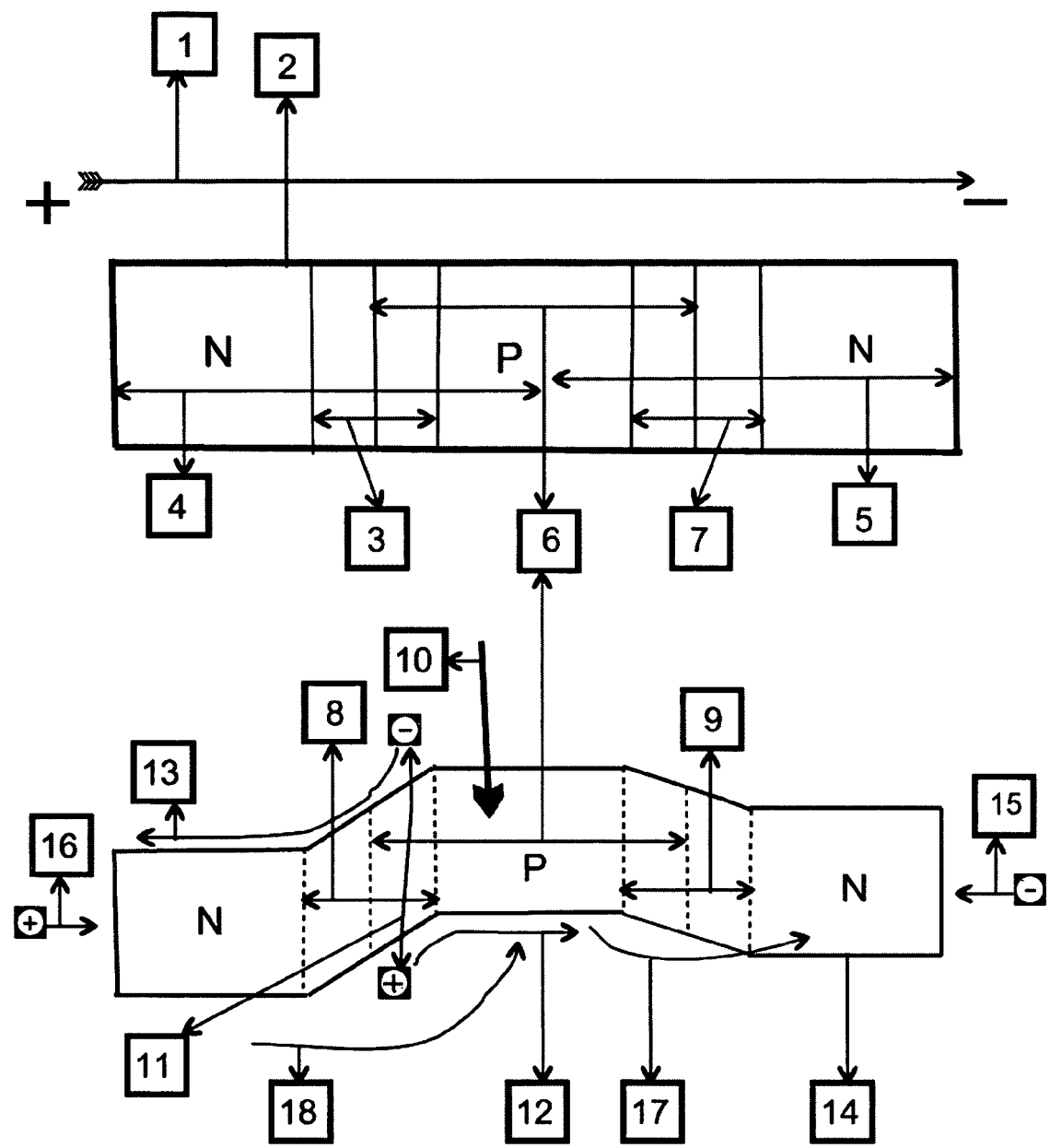
FIGURE 1 for NPN DEVICE

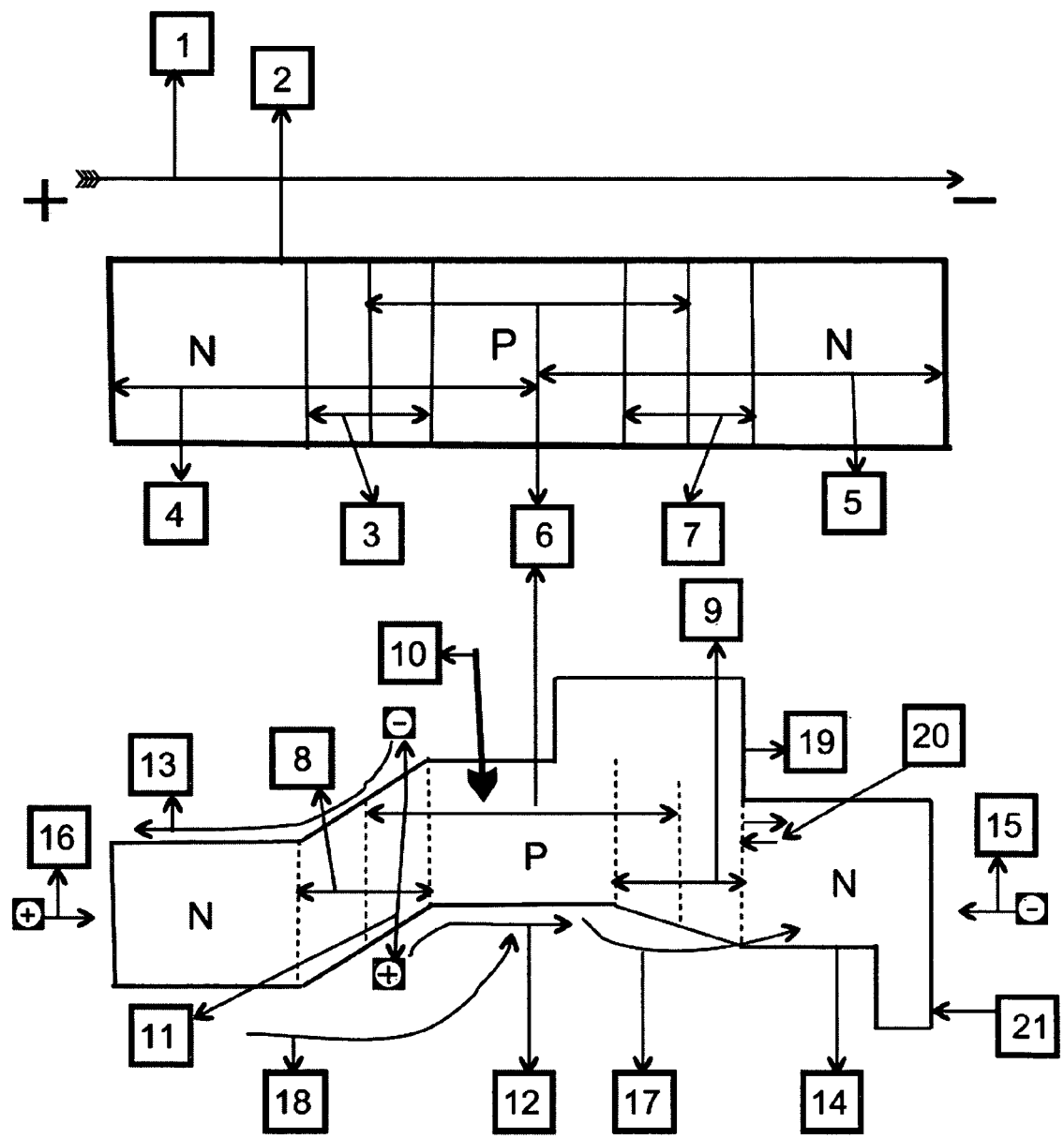
FIGURE 2 for NPN DEVICE

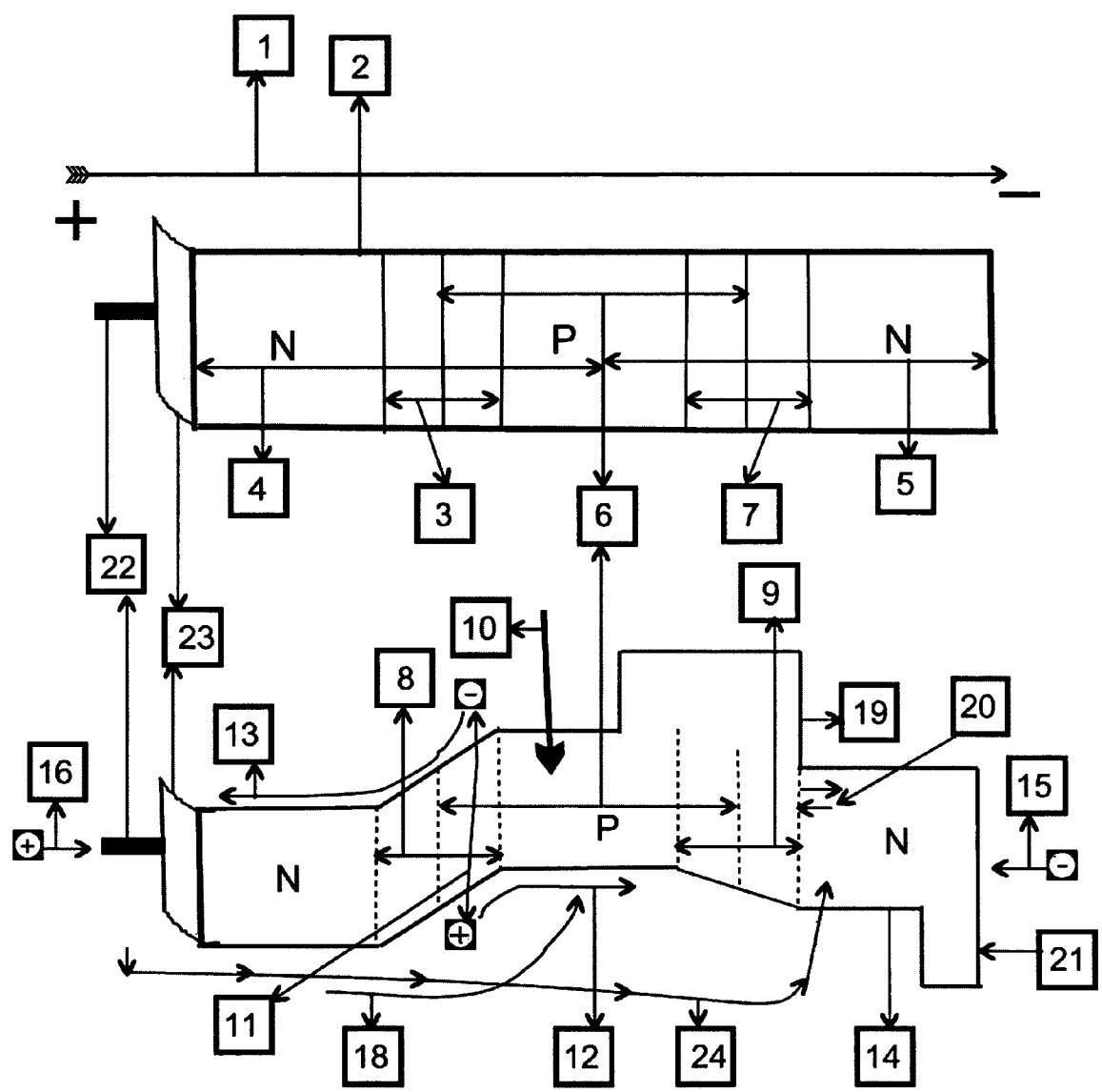
FIGURE 3 for NPN DEVICE

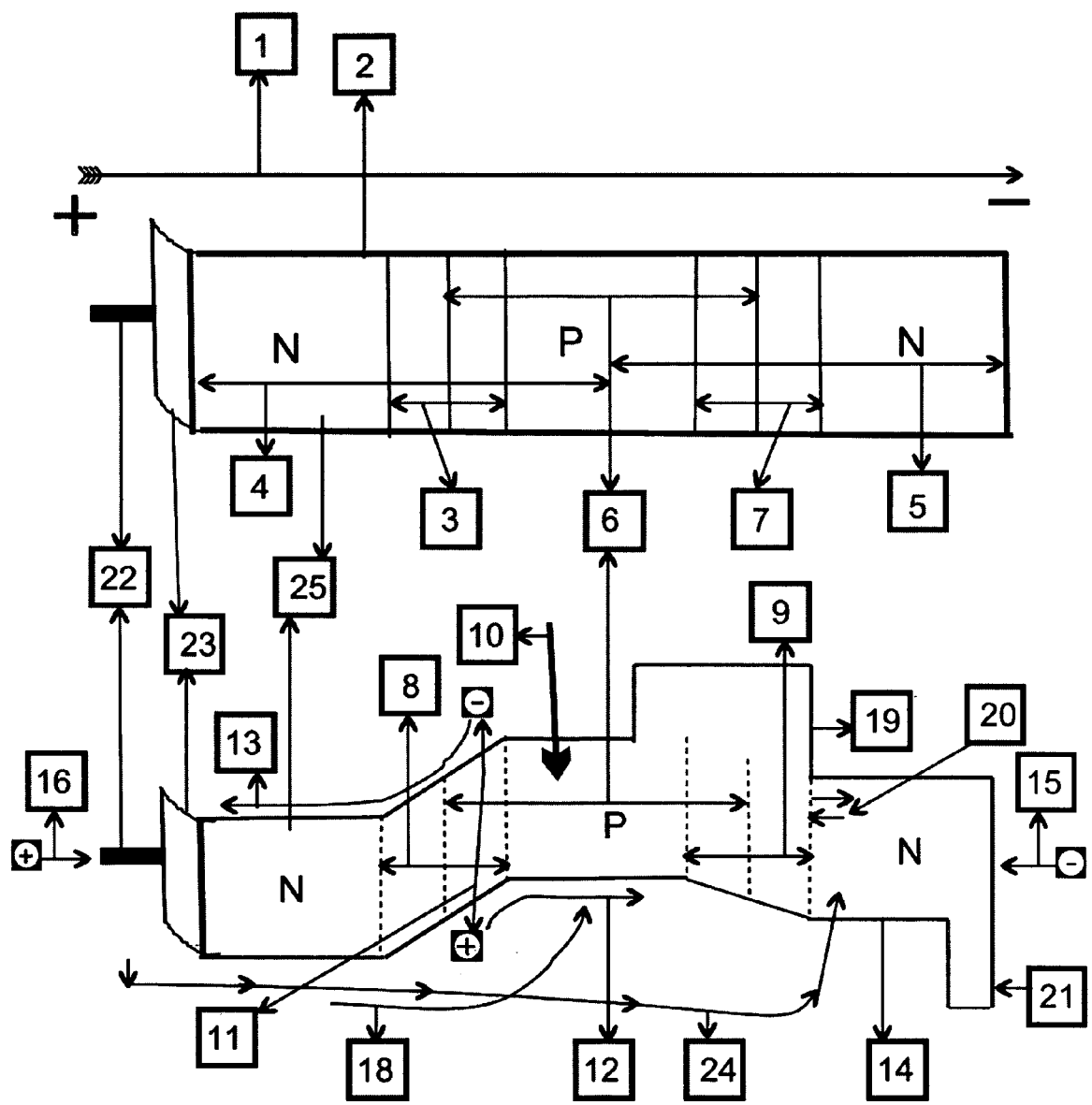
FIGURE 4 for NPN DEVICE

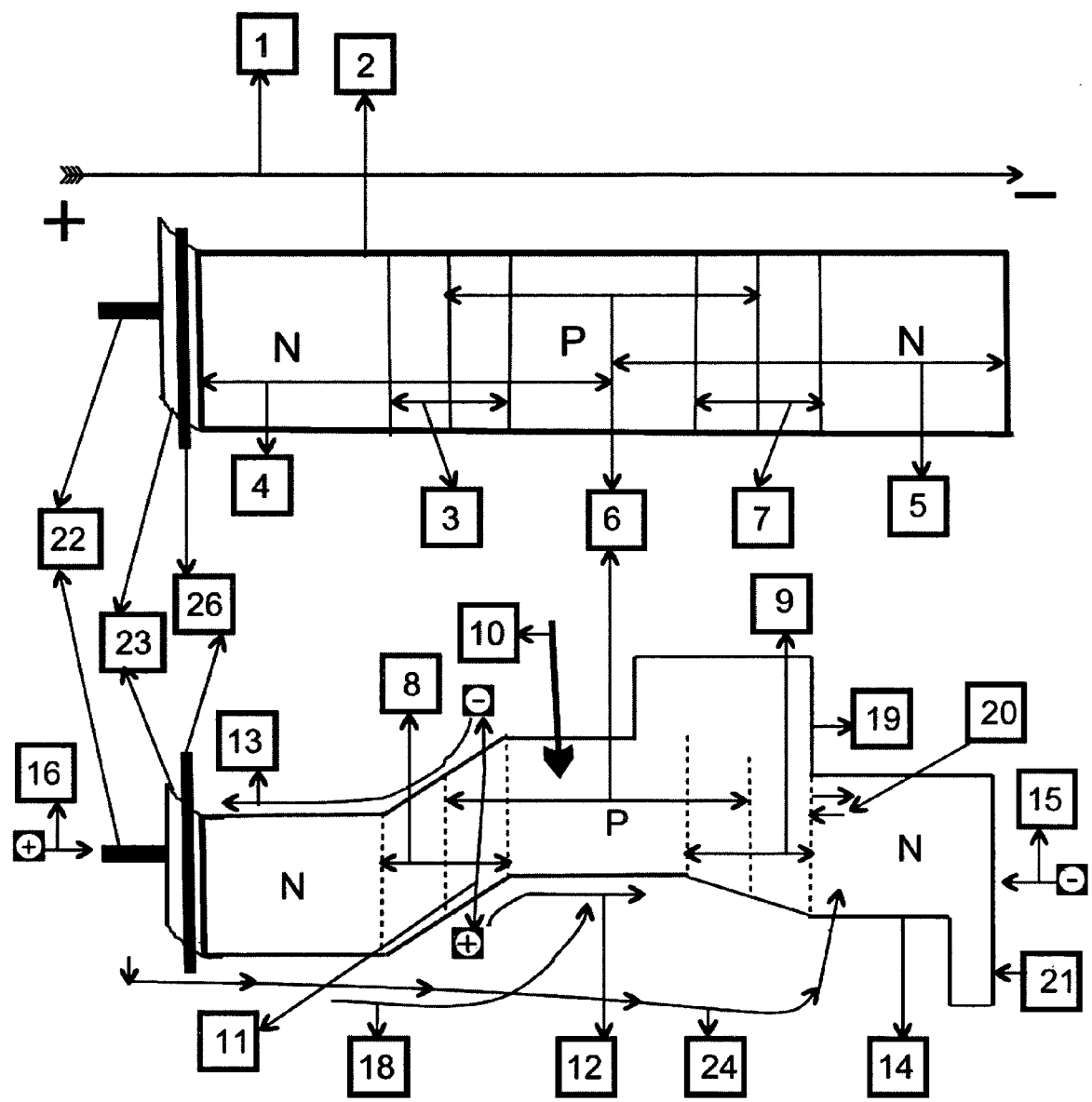
FIGURE 5 for NPN DEVICE

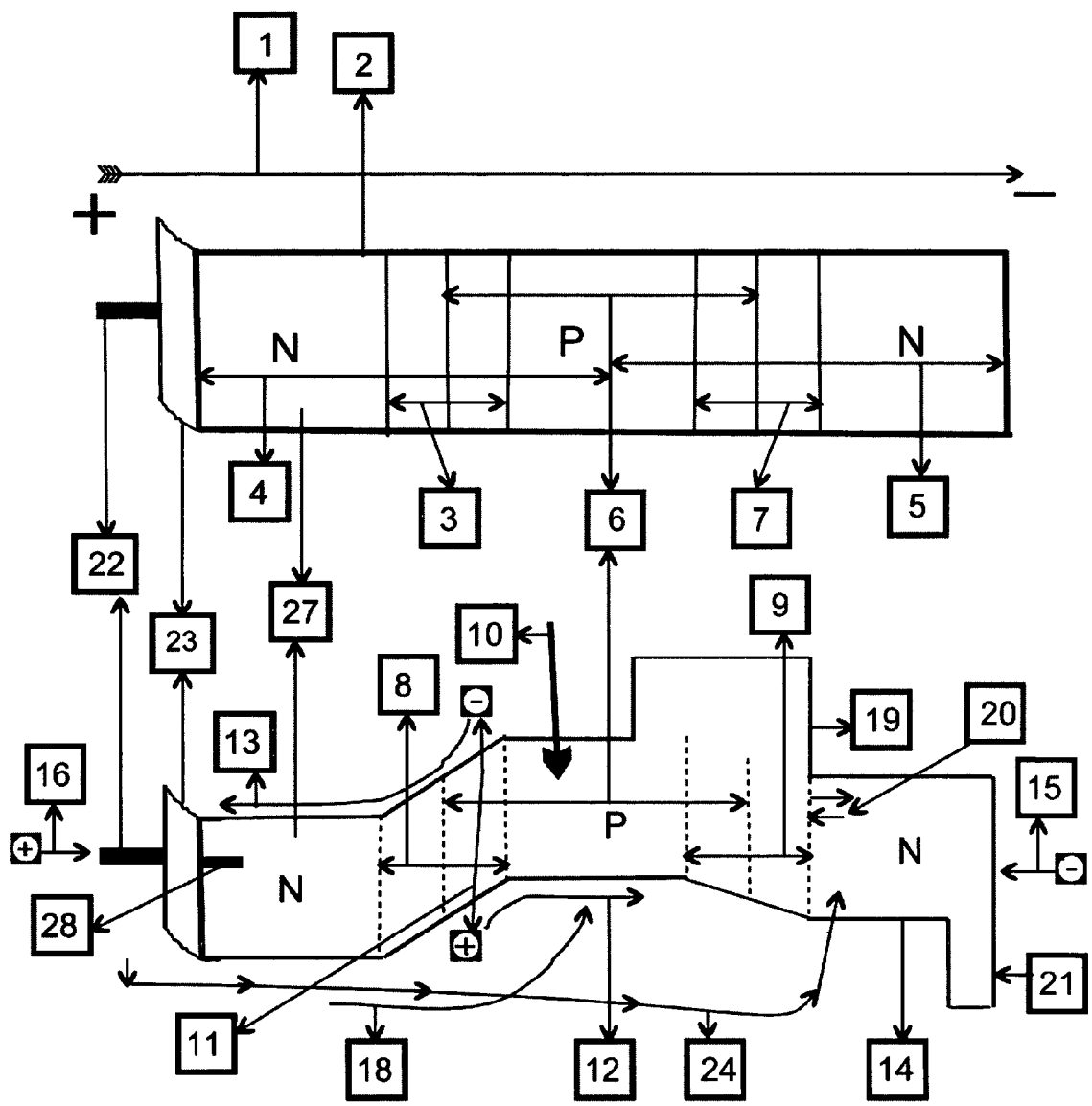
FIGURE 6 for NPN DEVICE

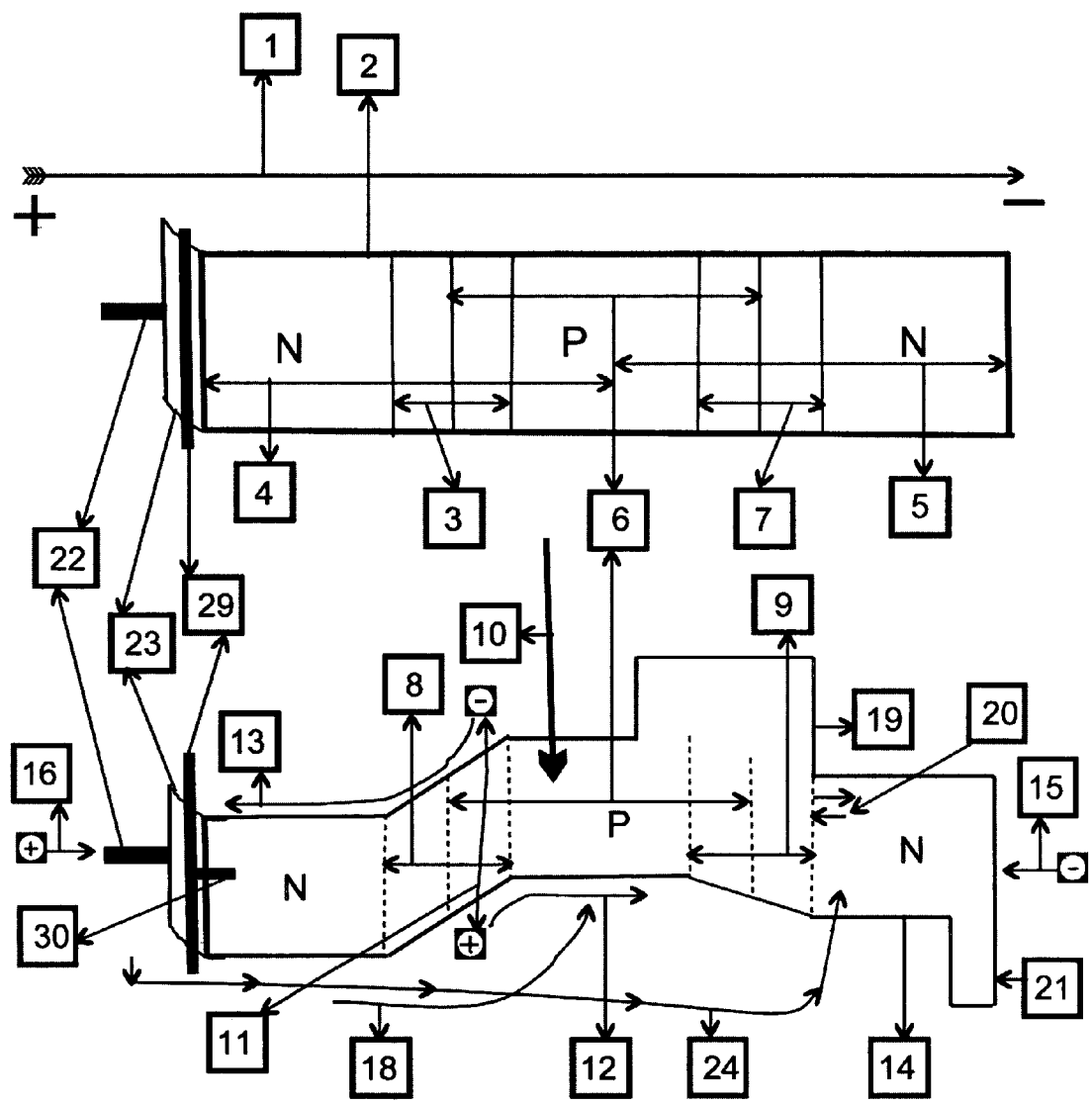
FIGURE 7 for NPN DEVICE

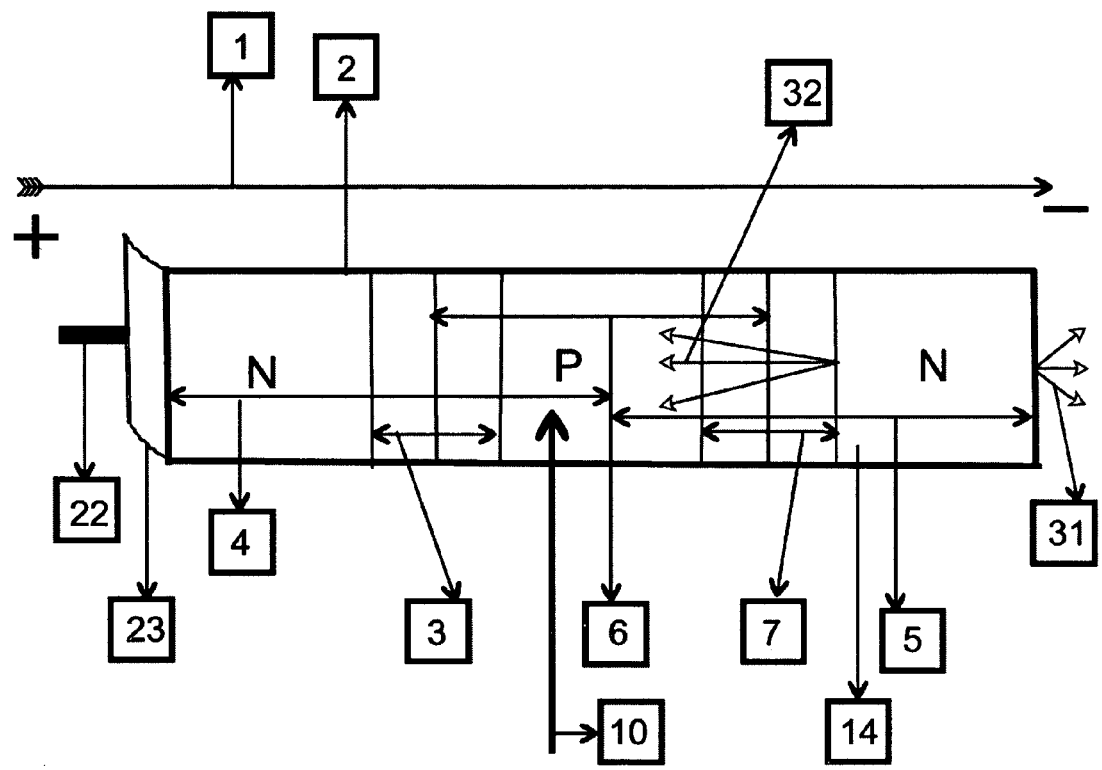
FIGURE 8 for NPN DEVICE

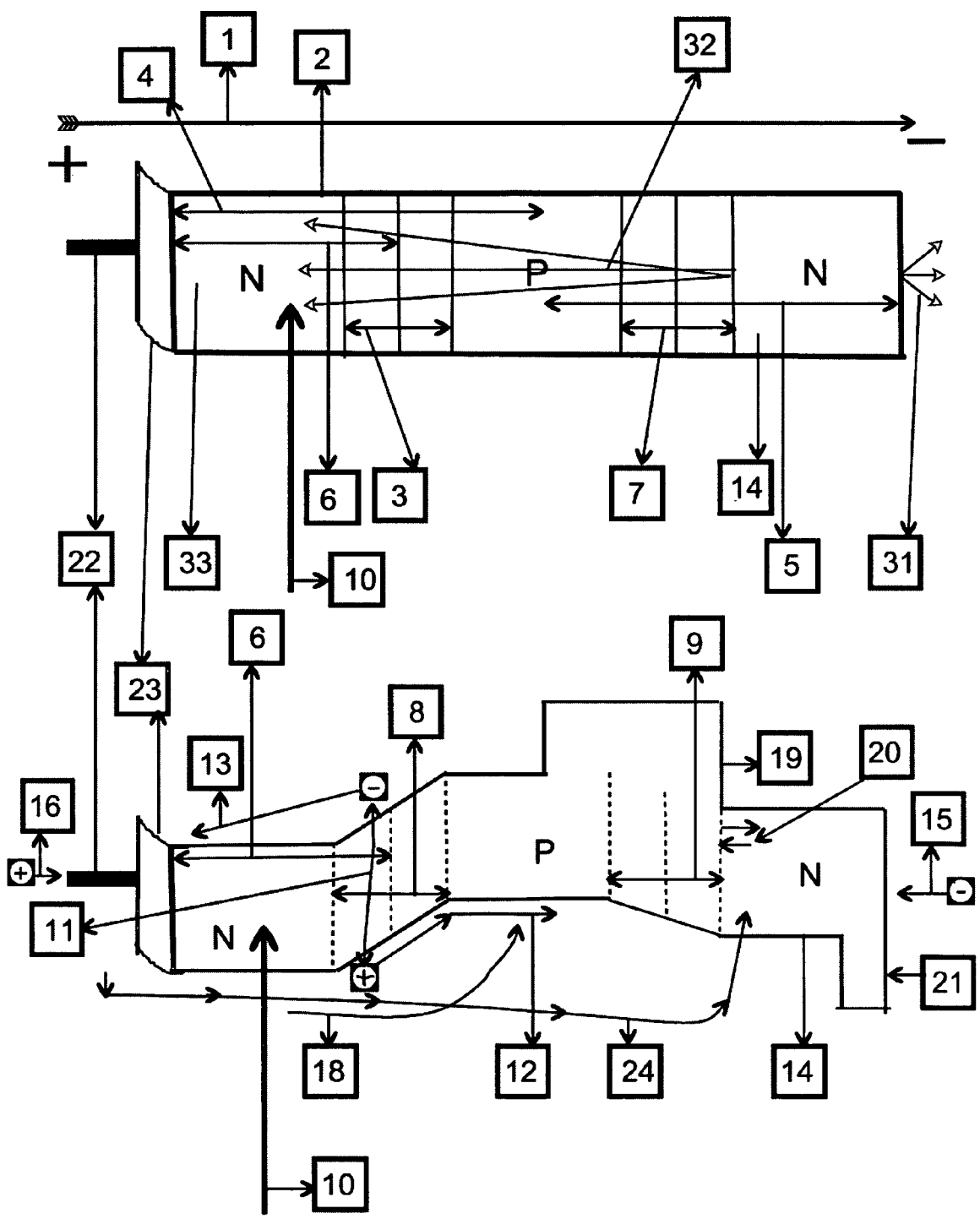
FIGURE 9 for NPN DEVICE

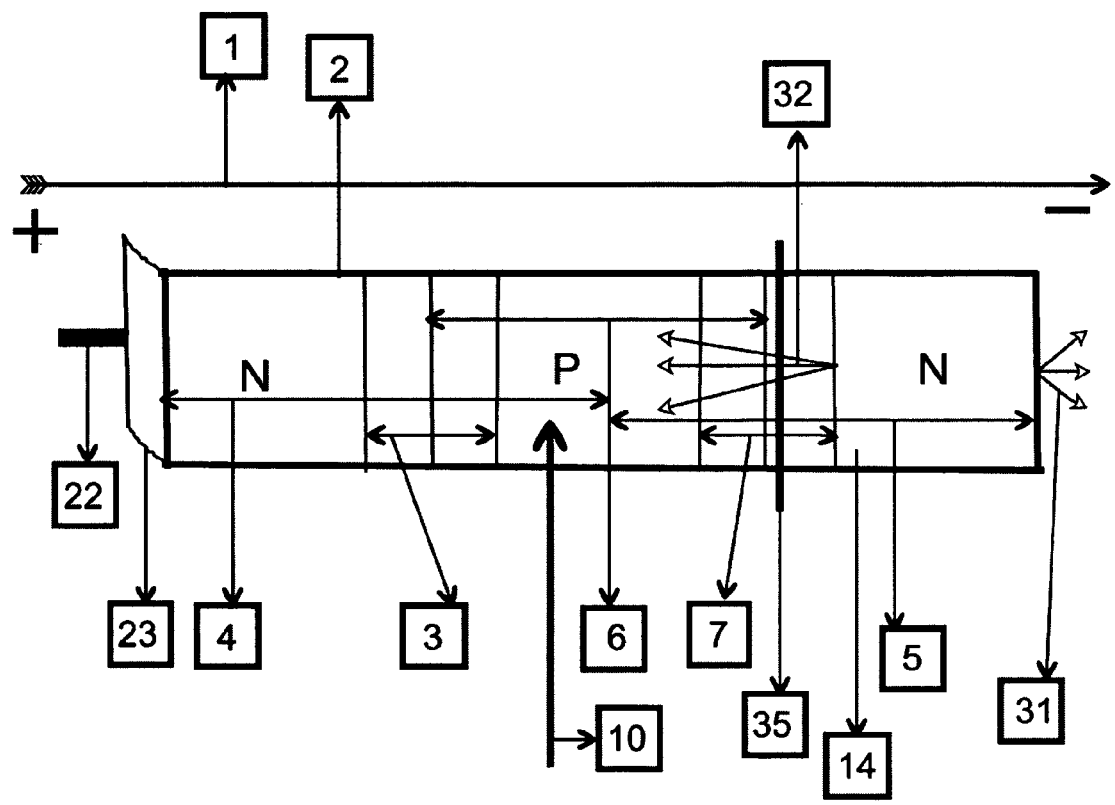
FIGURE 10 for NPN DEVICE

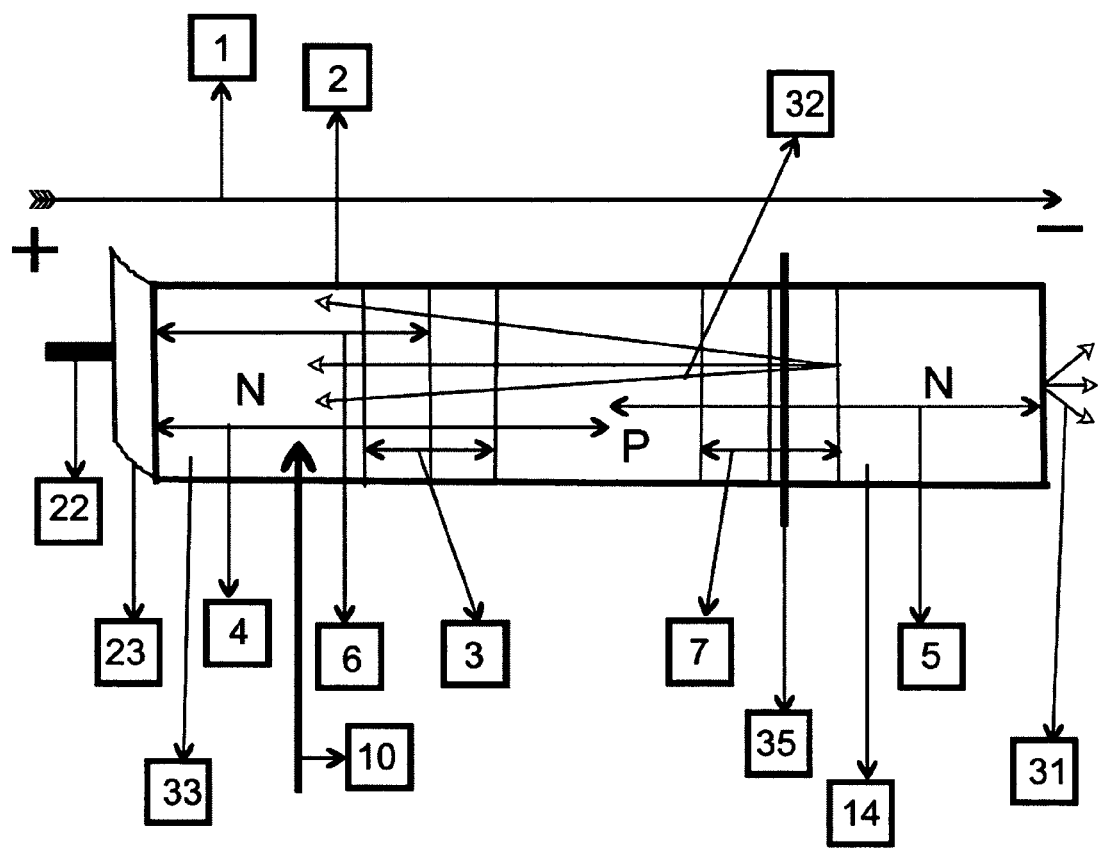
FIGURE 11 for NPN DEVICE

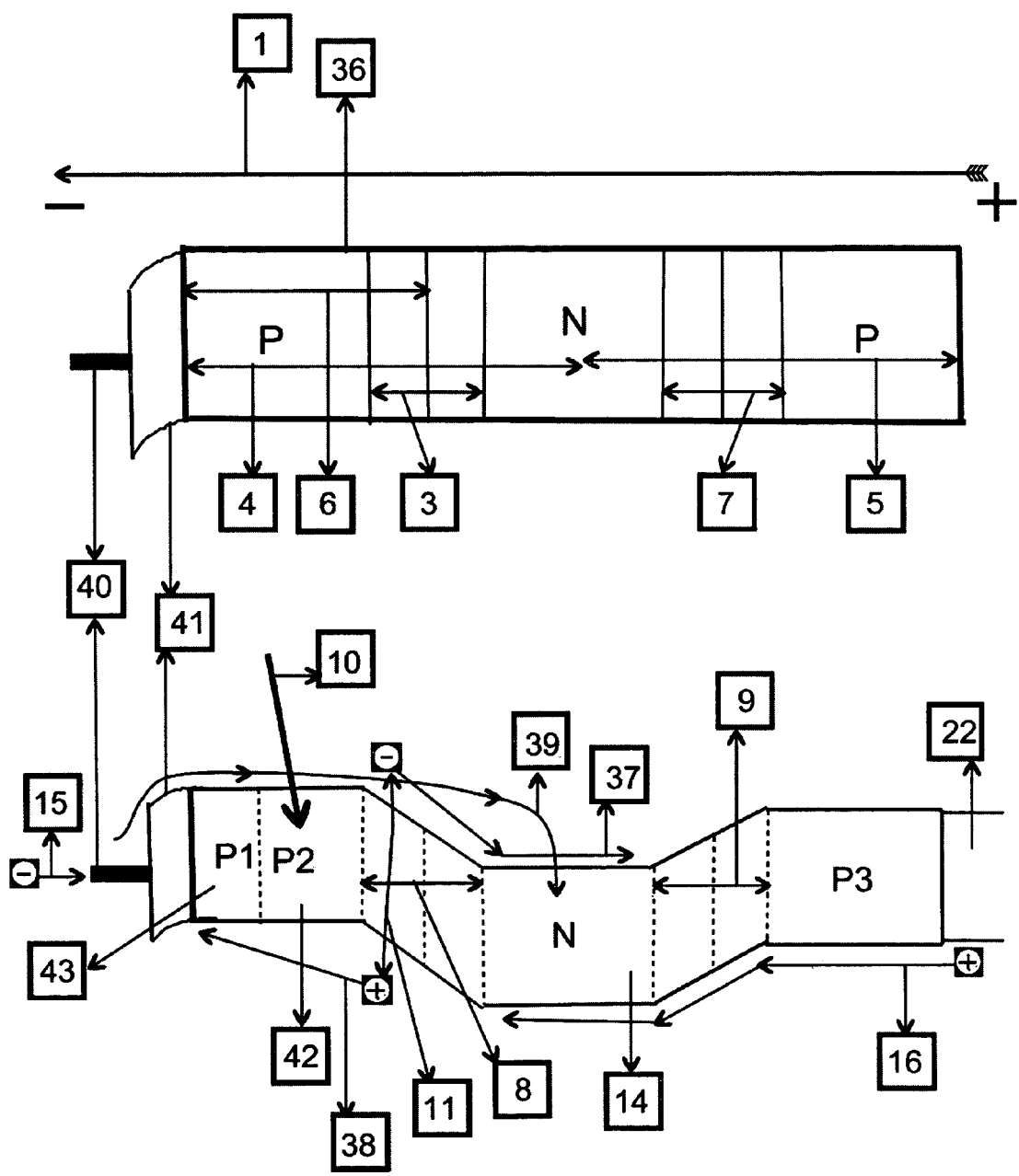
FIGURE 12 for PNP DEVICE

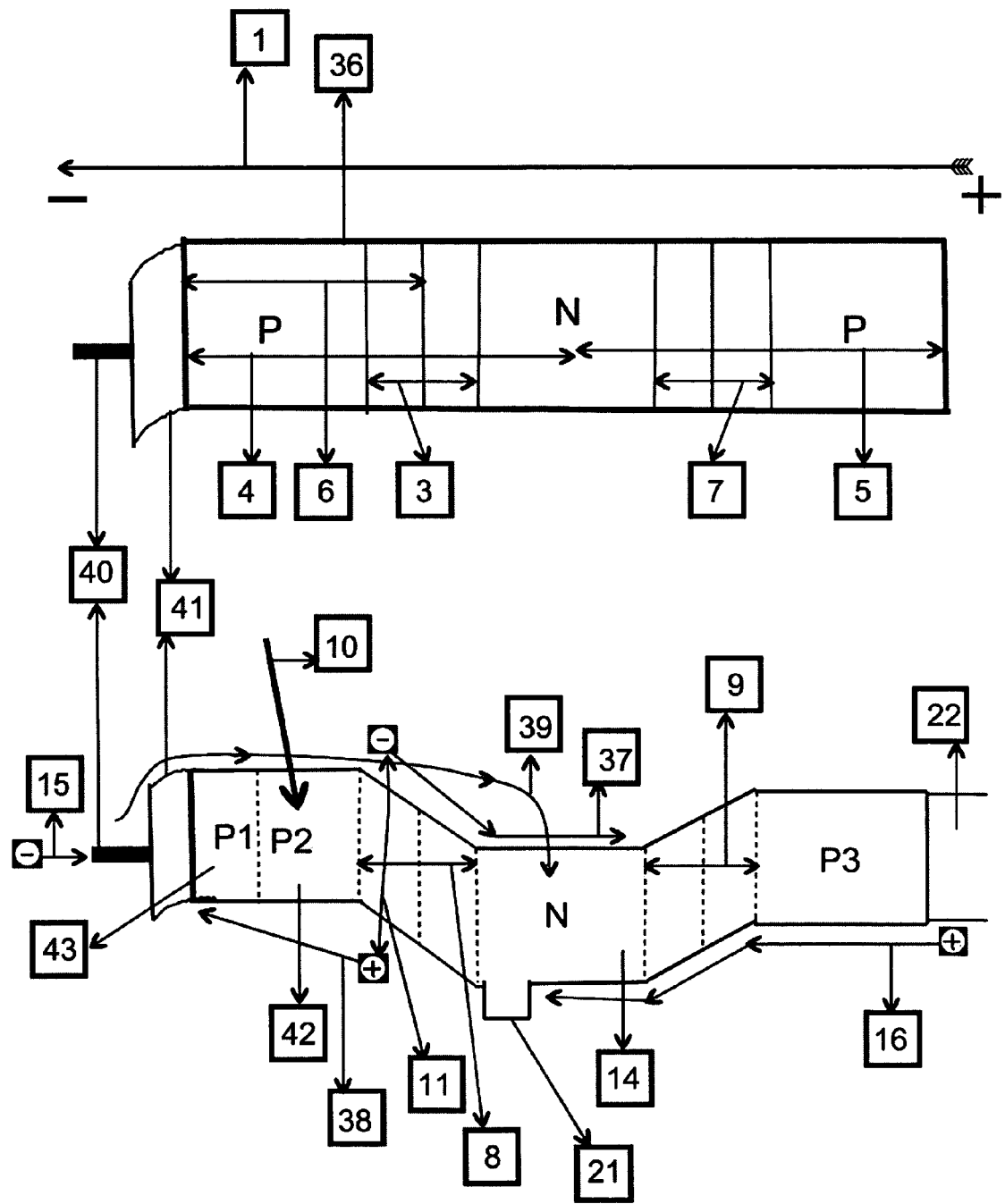

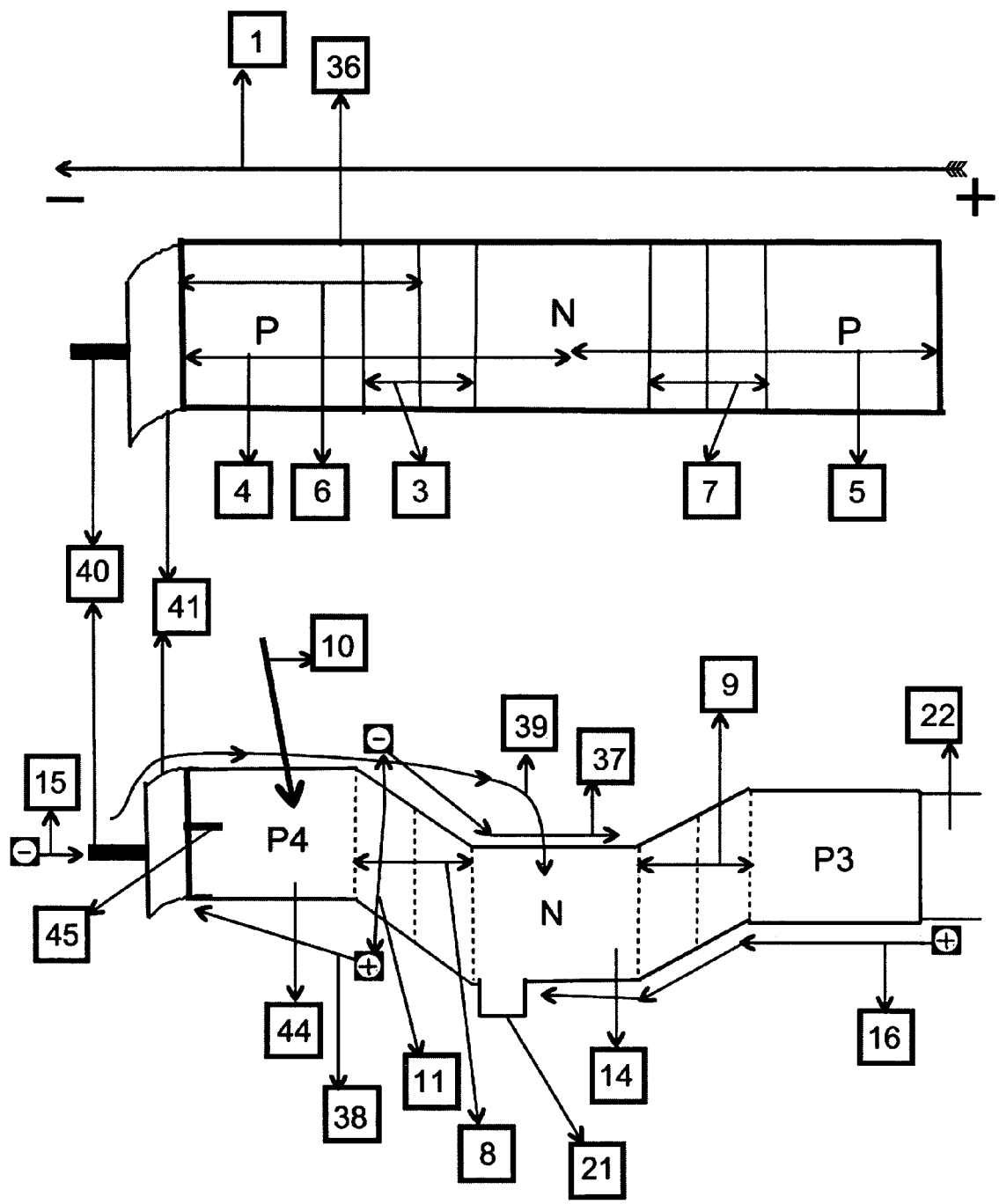
FIGURE 14 for PNP DEVICE

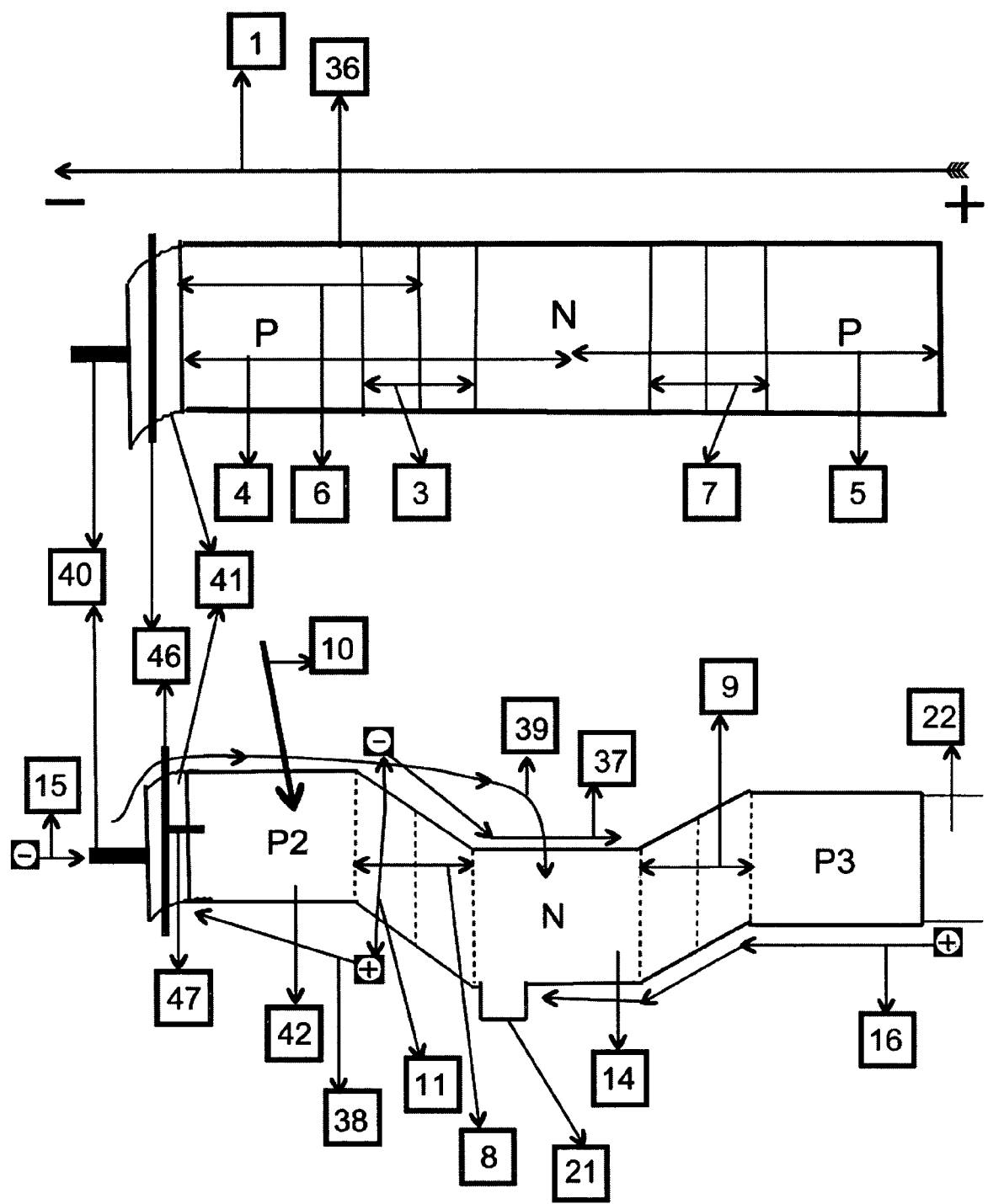
FIGURE 15 for PNP DEVICE

FIGURE 16 for PNP DEVICE
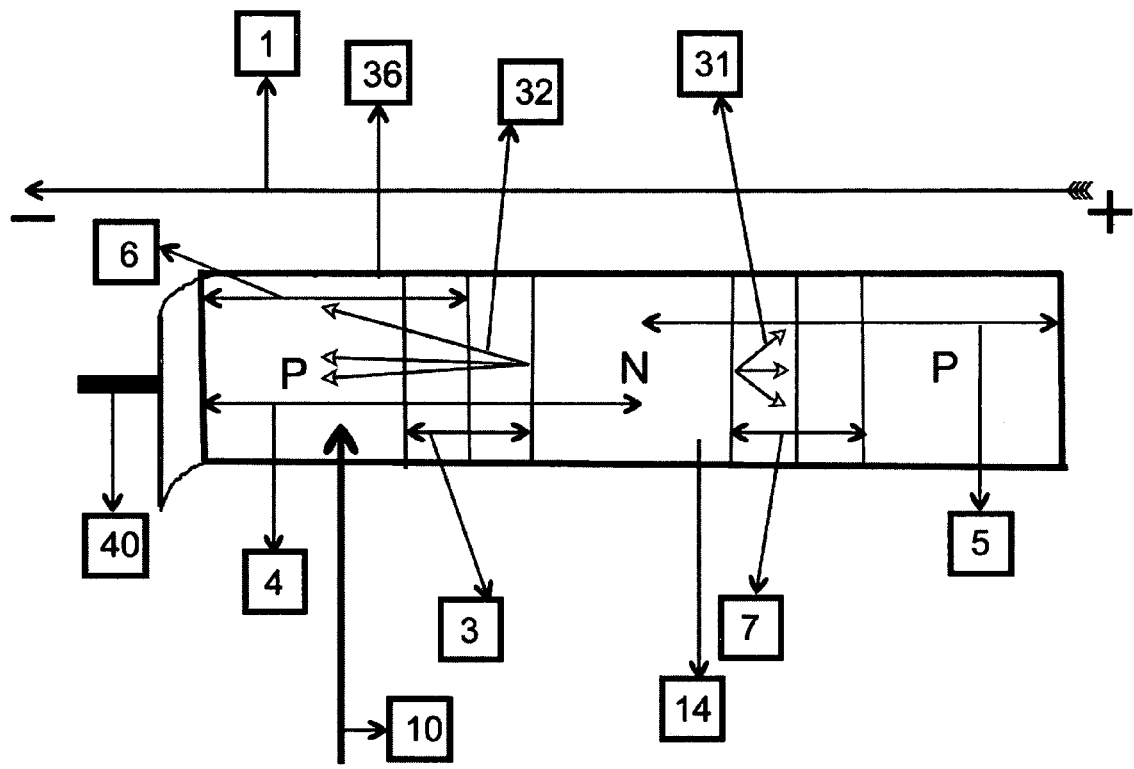

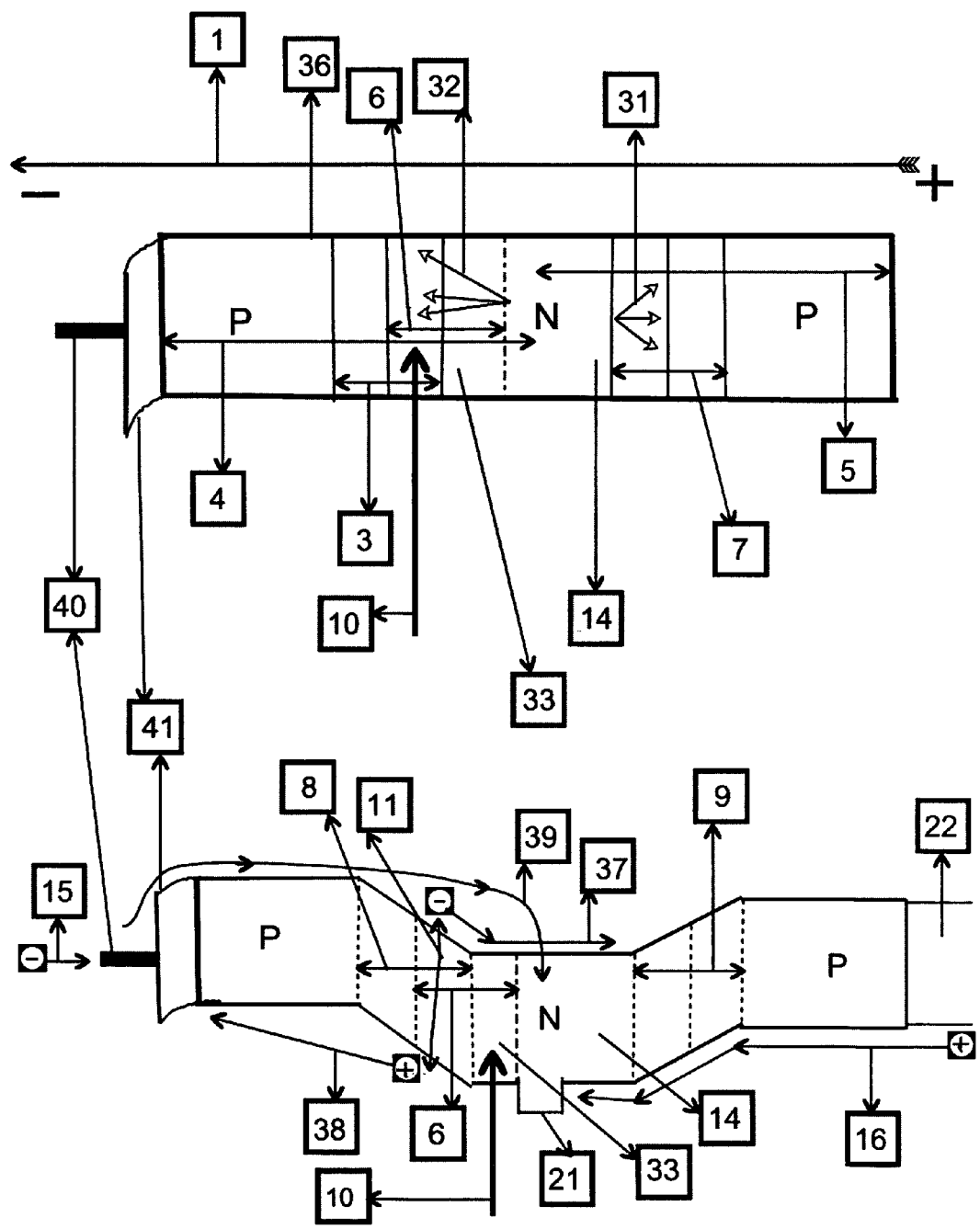
FIGURE 17 for PNP DEVICE

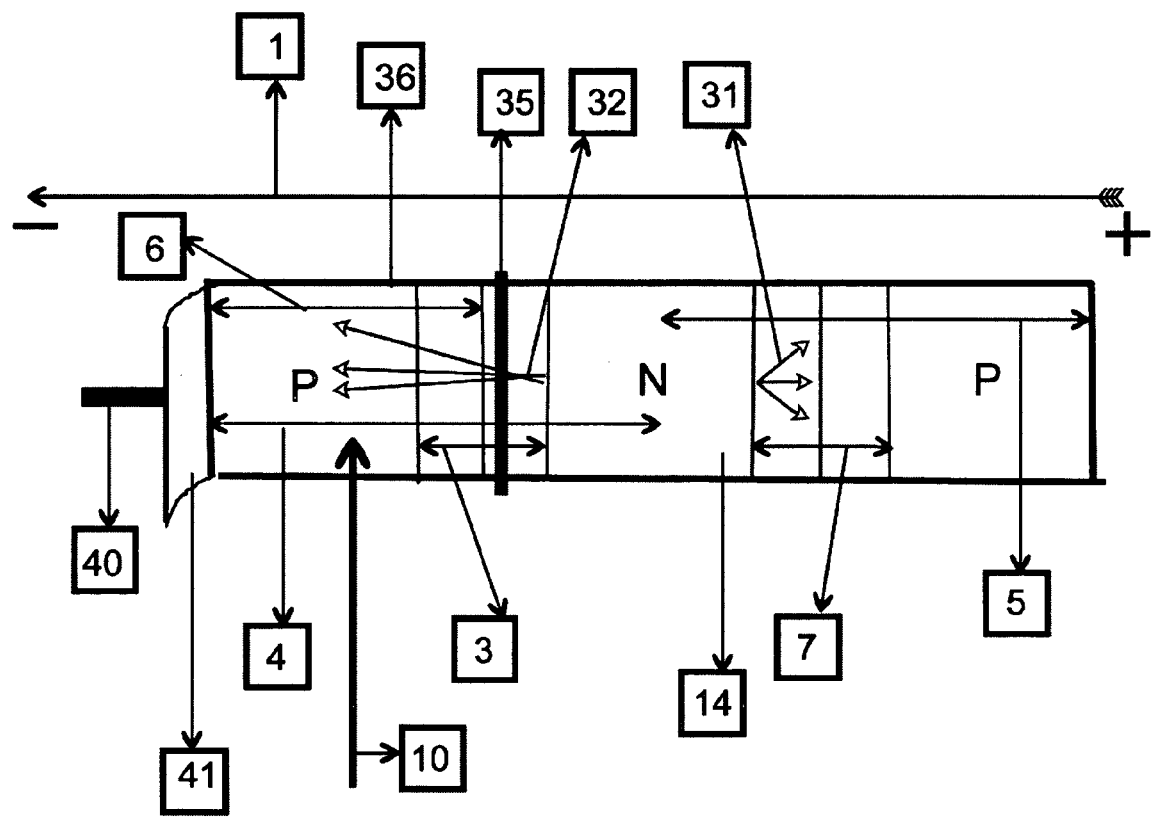

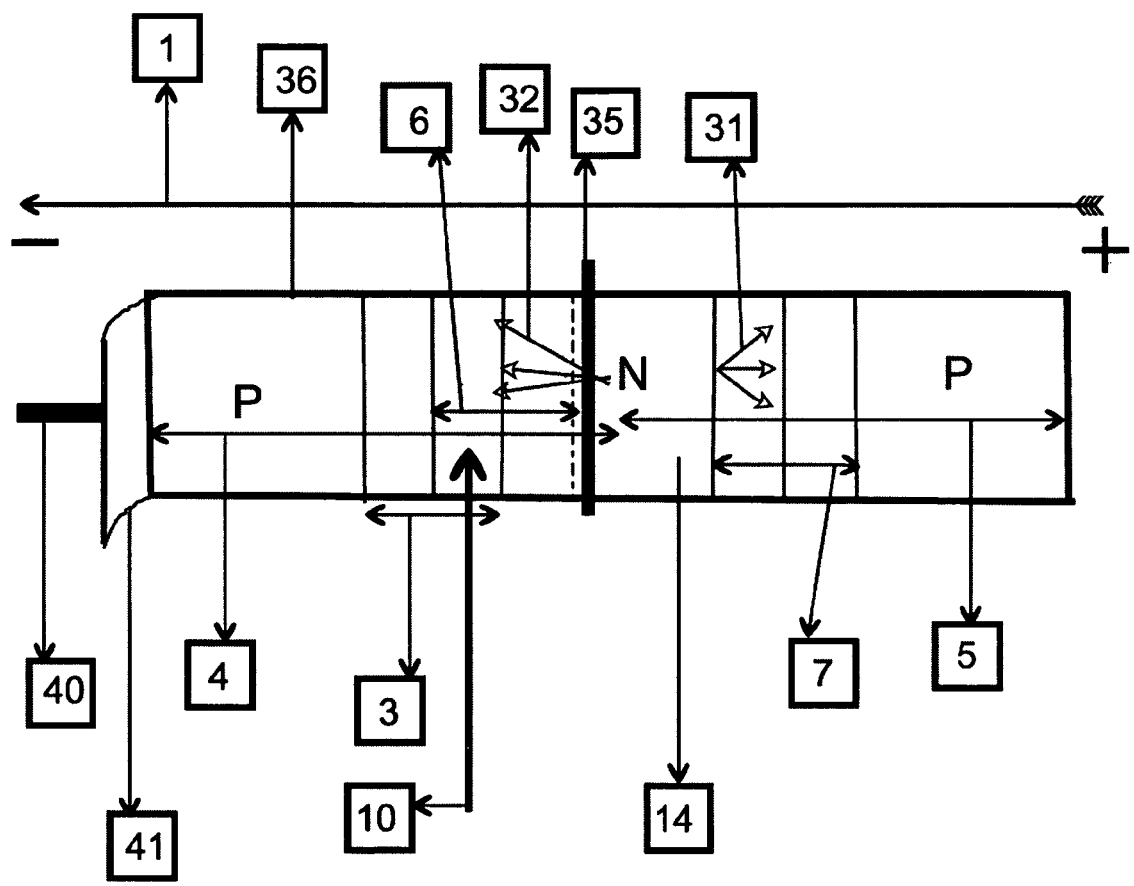
FIGURE 19 for PNP DEVICE

FIGURE 20 for NPN DEVICE
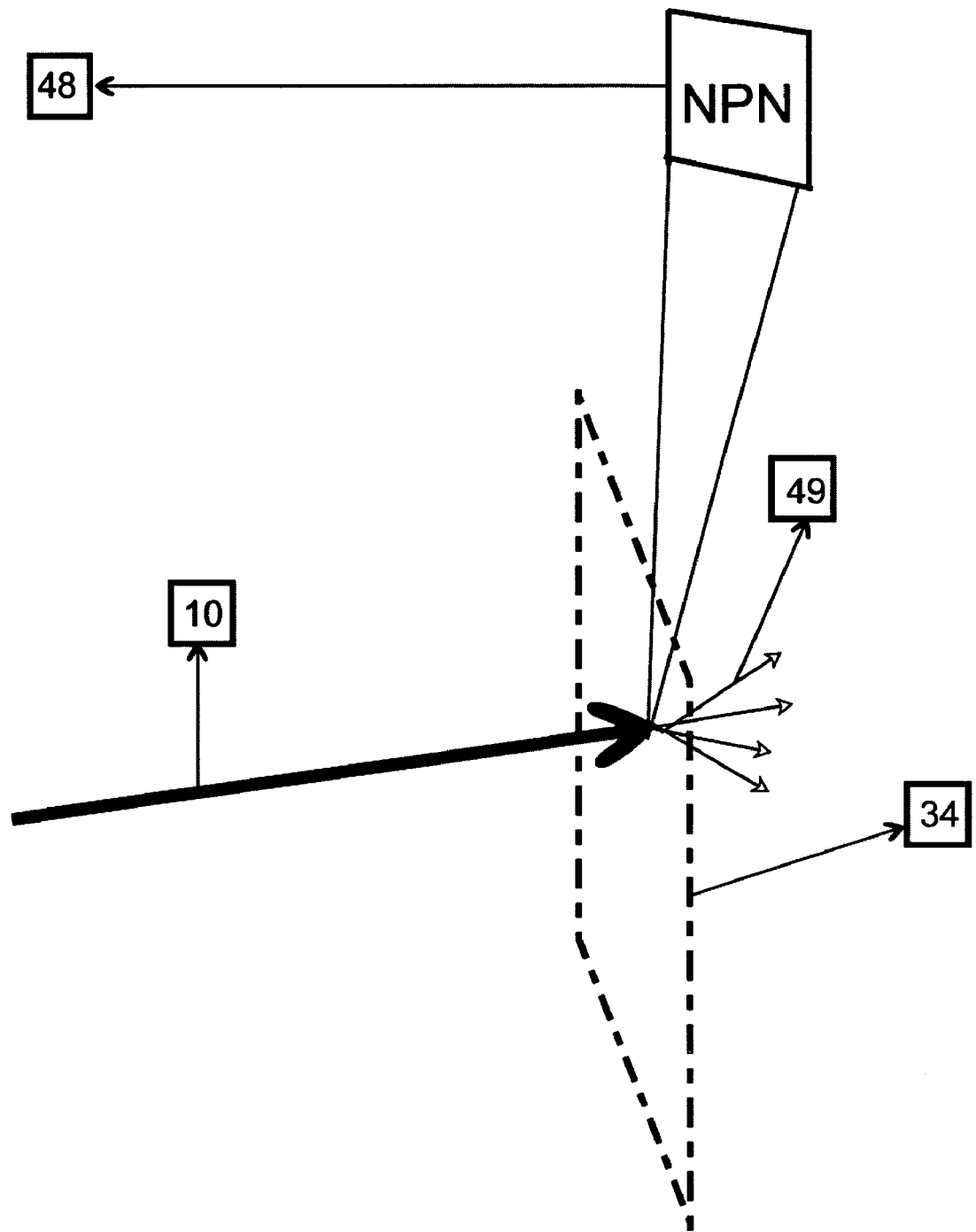

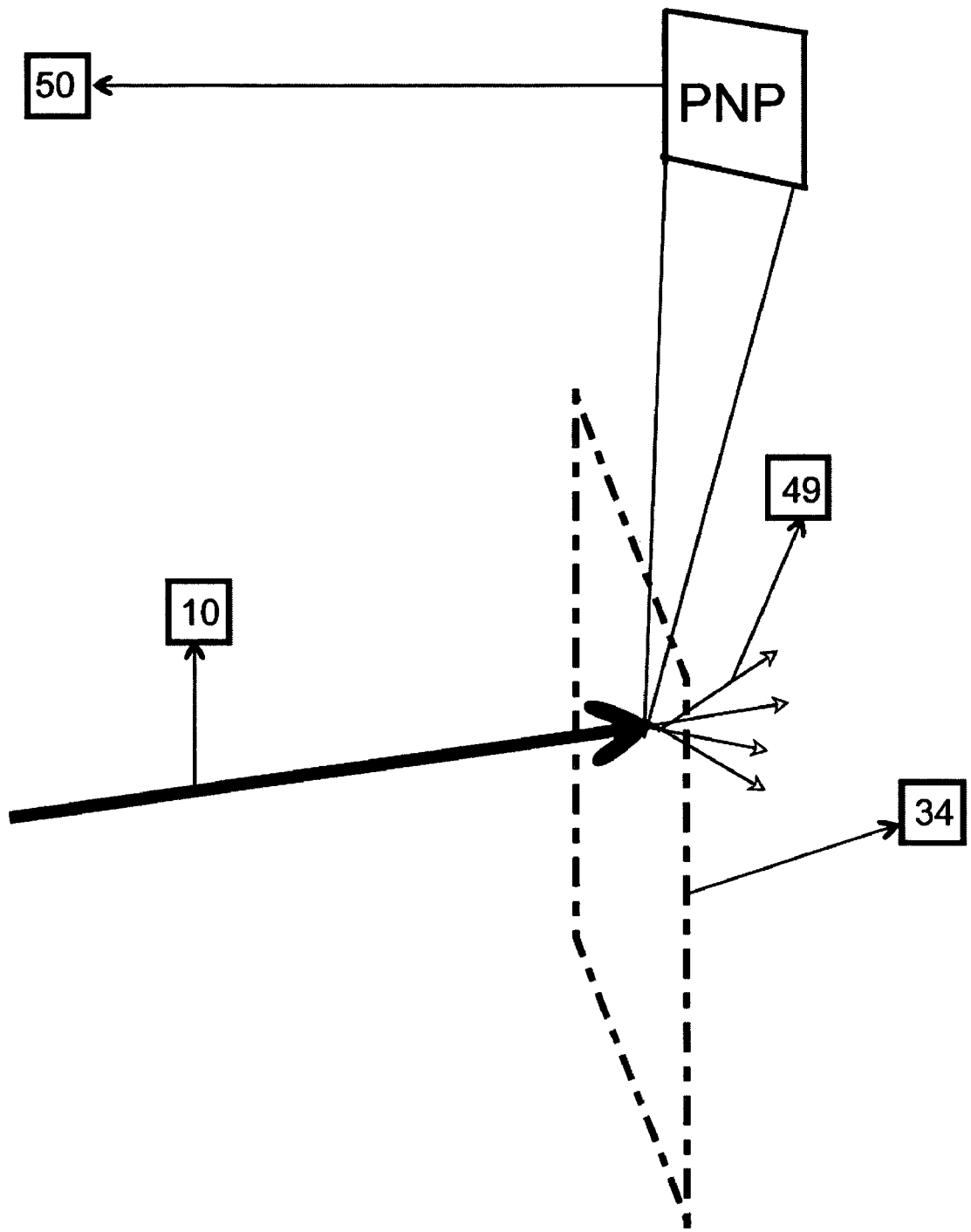
FIGURE 21 for PNP DEVICE

LASER ADDRESSED MONOLITHIC DISPLAY

BACKGROUND OF THE INVENTION

The invention relates to a monolithic display device, scanned by a laser in presence of an applied electric field, comprised of a light-sensing area and a light-emitting area such that an amplification of carriers within the device causes an emission of light. This emission of light is made to persist a frame period or more using carrier blocking materials, light-emitted feedback loop and materials with trap energy levels.

Prior art of the invention would involve projection type displays vastly different from the present invention, as these do not utilize a scanning laser to energize pixels on the display screen. Other prior art would involve display which use laser as the light source but not to energize pixels such as U.S. Pat. No. 6,636,274 and U.S. Pat. No. 6,594,090.

BRIEF SUMMARY OF THE INVENTION

The present invention relates to a display device utilizing a scanning LASER for addressing the area where it is intended to induce light output by the display. The display operates as a NPN or PNP photo-amplifying and light-emitting device. The device produces light output only from the areas where the LASER scans it. The principal ideas of the invention are: to address the display elements with an infrared laser, to amplify the light output and to prolong the light output of the pixel up to a frame period or more. The proposed photo-amplifying and light-emitting device described below, achieves this.

The NPN device operates in the presence of an external electric field across it, which biases its two P-N junctions as reverse biased and forward biased. As the LASER strikes the device on its P-type photosensitive region, charged pairs of electrons and holes are produced and are pulled apart by the cumulative electric field present at the reverse bias region. The holes thus produced reduce the forward bias barrier allowing for a large amount of holes to cross into an emissive N-type region. The emissive region allows this large influx of holes to recombine, with electrons coming due to the external electric field, and emit light. In another embodiment of the invention there is an electron blocker barrier at the forward biased junction that blocks the incoming electrons, due to the external field, to cross over the lowered forward bias barrier and retains them in the emissive region. A similar function is performed by a hole blocker, which retains the in coming holes in the flux by blocking the flow to go out of the emissive region in the external circuit. This retention of electrons and holes allows more time for recombination.

In another embodiment, a high work function metal is used, in the fabrication of the photo-amplifying and light-emitting device, forming a Schottky contact, with the non-emitting, N-type region creating a PNPN device. As the LASER strikes the P-type photosensitive region charged pairs are produced with those at the reverse bias P-N region flowing in opposite directions due to the cumulative electric field present. In this case, the electrons flow towards the Schottky contact and accumulate there. This charge accumulation lowers the potential barrier at the Schottky contact and allows holes to cross and flow into the emissive region to recombine with electrons and emit light. The electron and hole blocker techniques as are also incorporated as described before. After some time the dissipation of accumulated charge at or near the Schottky contact resets it thereby switching off the light output.

In another embodiment, the N-type material forming the Schottky contact is a material M1. The properties of the M1 allow for a slower dissipation of charge in the region of the Schottky contact such that it enables a continuous light output by the pixel for a frame period or more even after the scan. In yet another embodiment, the M1 material is replaced by M3 material having an extra trap energy level. Electrons arriving from the reverse bias region get trapped quickly and take longer to dissipate. This action allows continuous light output by the pixel as before.

In a further embodiment, there is a thin layer of a material M2 within the Schottky contact such that it affects the charge dissipation at or near the contact as in the case of material M1 with a similar result. The N-type material replaced earlier by M1 is used to form the Schottky contact is this case. In yet another embodiment, the M2 material is replaced by M4 material having an extra trap energy level for the arriving electrons, from the reverse bias region, which get trapped quickly and take longer to dissipate at or near the Schottky contact. This action again allows continuous light output by the pixel as before. In another embodiment, the high work function metal forming the Schottky contact is any high work function metal or a P-type semiconductor. In case of a semiconductor, the Schottky contact is then replaced by a P-N junction.

In another embodiment, in presence of an external electric field as before, a low work function metal is used in the fabrication of a PNP photo-amplifying and light emitting device, to form a Schottky contact with a P-type region made of a P2 photosensitive material. At the other end, P3 material forms a forward bias P-N junction. As the LASER strikes the P2 region, charged electron-hole pairs are produced and those pulled apart the reverse bias P-N region flowing in opposite directions as in the PNPN configuration. In this case, the holes flow towards and lower potential of the Schottky contact and allow electrons, from the low work function metal, to cross the potential barrier and flow into an N-type emissive region to recombine with holes and emit light. After a while, the dissipation of charge at or near the Schottky contact resets it, switching off the light output as before. Adding a material P1, with specific properties, to P2 to form the Schottky contact allows the charge dissipation at or near the Schottky contact to take longer, as required by the invention, enabling the pixel to be lighted continuously for a frame period or more. In another embodiment, the hole-blocker technique is also employed by adding a hole-blocker material in the PNP assembly. In another embodiment the P2 material or P2 along with P1 material is replaced by a material P4 having an extra trap energy level for the arriving electrons, from the reverse bias region, which get trapped quickly and take longer to dissipate. This action also allows continuous light output by the pixel as before. In yet another embodiment, a thin layer of a material P5 is placed within the Schottky contact having an extra trap energy level for the arriving electrons, from the reverse bias region, which get trapped quickly and take longer to dissipate. This action, again, allows continuous light output by the pixel as before. The P-type material P2 is used to form the Schottky contact in this case. In another embodiment, the low work function metal forming the Schottky contact is any low work function metal or a N-type semiconductor material. Again, the Schottky contact is replaced by a P-N junction in case of a semiconductor.

In another embodiment, applicable to the NPN and the PNP assemblies, the P-type photosensitive region is only sensitive to infrared light and the scanning LASER is therefore infrared. However, the emissive region being only a visible light emitter inhibits any feedback effects as the emitted light becomes incident on the photosensitive region. In still a further embodiment, the P-type photosensitive region is also photosensitive to visible light. This allows a feedback effect to take place whereby the emitted visible light incident on the photosensitive material produces charged pairs just like the incident LASER. This feedback effect enables the LASER addressed area, functioning like a pixel; to remain lighted for a frame period or more or until the external electric field is switched off. In another embodiment, applicable to NPN assembly, we replace the function of the P-type photosensitive region by a N-type photosensitive material forming the Schottky barrier and with the feedback mechanism, just described, being active. In the PNP case, the N-type photosensitive layer forms the reverse bias junction and is placed alongside the N-type emissive material. In the NPN case, a regular P-type material is used in place of the previous P-type photosensitive region. In another embodiment, with a visible light N-type emitter, the photosensitive region is sensitive to visible light and the photosensitive area of the device is either a P-type or a N-type material as in previous embodiments. In addition, there is a filter placed as such that the emitted visible light coming from the display area and other ambient light is filtered, without affecting the LASER, for a select narrow band of visible light to strike the photosensitive area and provide a feedback effect.

BRIEF DESCRIPTION OF THE DRAWINGS

FIG. 1 illustrates an NPN device with an external electric field across it and an incident LASER initiating a current amplification and light emission process.

FIG. 2 illustrates an NPN device with an external electric field across it and an incident LASER initiating a current amplification and light emission process with an electron and hole blocker arrangement.

FIG. 3 illustrates an NPN device, with a Schottky contact, with an external electric field across it and an incident LASER initiating a current amplification and light emission process with an electron and hole blocker arrangement.

FIG. 4 illustrates an NPN device, with a Schottky contact and N-type material M1, with an external electric field across it and an incident LASER initiating a current amplification and light emission process with an electron and hole blocker arrangement.

FIG. 5 illustrates an NPN device, with a Schottky contact containing thin layer N-type material M2, with an external electric field across it and an incident LASER initiating a current amplification and light emission process with an electron and hole blocker arrangement.

FIG. 6 illustrates an NPN device, with a Schottky contact and N-type material M3 with trap energy level, with an external electric field across it and an incident LASER initiating a current amplification and light emission process with an electron and hole blocker arrangement.

FIG. 7 illustrates an NPN device, with a Schottky contact containing N-type material M4 with trap energy level, with an external electric field across it and an incident LASER initiating a current amplification and light emission process with an electron and hole blocker arrangement.

FIG. 8 illustrates an NPN device, with a Schottky contact, with an external electric field across it and an incident LASER initiating a current amplification and light emission process with emitted light incident on P-type photosensitive region for feedback loop.

FIG. 9 illustrates an NPN device, with a Schottky contact, with an external electric field across it and an incident LASER initiating a current amplification and light emission process with emitted light incident on N-type photosensitive region for feedback loop along with an electron and hole blocker arrangement.

FIG. 10 illustrates an NPN device, with a Schottky contact, with an external electric field across it and an incident LASER initiating a current amplification and light emission process with emitted light incident on P-type photosensitive region, through a filter, for feedback loop.

FIG. 11 illustrates an NPN device, with a Schottky contact, with an external electric field across it and an incident LASER initiating a current amplification and light emission process with emitted light incident on N-type photosensitive region, through a filter, for feedback loop.

FIG. 12 illustrates an PNP device with N-type materials P1 and P2, with a Schottky contact, with an external electric field across it and an incident LASER initiating a current amplification and light emission process.

FIG. 13 illustrates an PNP device with N-type materials P1 and P2, with a Schottky contact, with an external electric field across it and an incident LASER initiating a current amplification and light emission process along with a hole blocker arrangement.

FIG. 14 illustrates an PNP device with N-type material P4 with a trap energy level, with a Schottky contact, with an external electric field across it and an incident LASER initiating a current amplification and light emission process along with a hole blocker arrangement.

FIG. 15 illustrates an PNP device, with a Schottky contact containing thin layer of N-type material P4 with a trap energy level, with an external electric field across it and an incident LASER initiating a current amplification and light emission process along with a hole blocker arrangement.

FIG. 16 illustrates an PNP device, with a Schottky contact, with an external electric field across it and an incident LASER initiating a current amplification and light emission process with emitted light incident on P-type photosensitive region for feedback loop.

FIG. 17 illustrates an PNP device, with a Schottky contact, with an external electric field across it and an incident LASER initiating a current amplification and light emission process with emitted light incident on N-type photosensitive region for feedback loop along with a hole blocker arrangement.

FIG. 18 illustrates an PNP device, with a Schottky contact, with an external electric field across it and an incident LASER initiating a current amplification and light emission process with emitted light incident on P-type photosensitive region, through a filter, for feedback loop.

FIG. 19 illustrates an NPN device, with a Schottky contact, with an external electric field across it and an incident LASER initiating a current amplification and light emission process with emitted light incident on N-type photosensitive region, through a filter, for feedback loop.

FIG. 20 illustrates an NPN device forming display screen being addressed with a LASER on a small part of it that acts like a pixel.

FIG. 21 illustrates an PNP device forming display screen being addressed with a LASER on a small part of it that acts like a pixel.

DETAILED DESCRIPTION OF THE INVENTION

To facilitate description any numeral identifying an element in one figure will represent the same element in any other figure.

FIG. 20 and FIG. 21 represent the functioning of the proposed display screen 34. Light is emitted 49 from the screen 34 only from the area illuminated by the laser. This area performs as a photo-amplifying and light-emitting device 48 or 50 as will be described in detail in the following. As the light emission occurs only from a restricted area, at a certain time this creates the equivalent of an addressed pixel. By scanning the LASER 10 across the screen 34, we can generate and address all pixels on the screen.

In case of a first embodiment, with reference to FIG. 1 and FIG. 12, we have NPN and PNP photo-amplifying and light-emitting devices respectively. Both devices use negatively charged electrons and positively charged holes as carriers of current. Both devices in FIG. 1 and FIG. 12 have an external electric field 1 across it and in this state; there is no current flowing across either device. The direction of the external electric field 1 implies that region 4, for both cases, is reverse biased. In the case of reverse biasing, an external voltage is applied to a P-N junction such that the potential at a P-type semiconductor is made negative with respect to the potential at the N-type. This increases the potential barrier at the junction of the two types of semiconductors and it increases the width of a depletion layer at the P-N junction. Thus, the effect of the external electric field 1 on FIG. 1 and FIG. 12 is such that it reverse biases the region 4. This reverse bias causes the internal potential barrier, created at the P-N junction in the region 3, for both cases, to become higher so that very little current flows across this P-N junction.

In the case of a NPN photo-amplifying and light-emitting device 2, with reference to FIG. 1, there is a photosensitive region 6, not available in a normal device. When a light source (LASER) 10 is incident, upon the photosensitive region 6, it produces electron-hole pairs all over the region 6. Carriers 11, generated within the depletion region 3, and approximately one diffusion length from the depletion region in the P-type material 6 are pulled apart by the combined influence of the external electric field 1 and the internal electric field 8 at the reverse bias junction 3. As such the electrons are pulled and directed to go towards the N-type region 13 and the holes 12 get transported as a small current, which is proportional to the intensity of the incident light source 10, to get accumulated at forward bias P-N junction in region 7. This accumulation of holes lowers the forward bias potential barrier 9. The lowering of the forward bias barrier 9 by the small hole current 12, allows relatively a very large hole current 17 to flow. Once this potential barrier 9 is lowered, these holes 17 form a very large current as compared to the small current 12 generated by the incident light source 10 in the photosensitive region 6, and flow into the N-type region 14. The holes 17 are replenished by still more holes injected 16 at anode contact through the N-type region 18. The larger hole current 17 is thus an amplification whereby a small hole current 12, generated by the incident light source 10 under the influence of the external electric field 1 and the P-N junction field 8, results in a much larger hole current 17 into the N-type region 14 in the forward bias region 5. The holes arriving into the N-type region 14 recombine with electrons 15 injected through the cathode contact by the external electric field. The N-type region 14 is an emissive region where recombination of electrons and holes takes place as well as emission of light due to that recombination. Thus, the holes 17 recombine with electrons 15 and emit light from region 14.

In another embodiment of the invention, with reference to FIG. 2, we have a NPN photo-amplifying and light-emitting device with an additional material which functions as an electron blocker barrier 19. Here we have, initially, an identical process taking place as in the case of FIG. 1 NPN photo-amplifying and light-emitting device i.e. the process in which the incident light source 10 strikes the photosensitive region 6 and from the resulting charged electron-hole pairs in the region 6 the ones 11 near the reverse bias junction 3 give rise to the small hole current 12 which in turn allows the accumulation of holes near the depletion region 7. There again it follows the same sequence of events whereby the accumulation of holes due to the small hole current 12 lowers the internal potential barrier 9 and allows holes in the P-type region to flow in form of a much larger current 17 into the N-type region 14. The larger hole current 17, resulting from the incident light source (LASER) 10 at region 6, goes into the N-type emitter region where these holes 17 are blocked by a hole-blocker 21, allowing the holes 17 to accumulate in region 14. Electrons 15, injected through the cathode into the N-type region due to the external electric field 1, are blocked 20 by the electron blocker barrier 19 and this gives the electrons and holes enough time to recombine. The electrons and holes then recombine allowing for light emission from the emissive N-type region 14.

In another embodiment of the invention, with reference to FIG. 3, we have the equivalent of a PNPN assembly wherein a high work function metal 22, specifically ITO or Indium Tin Oxide, which is a transparent conductive layer, forms a Schottky contact 23 with the N-type organic semiconductor or specifically tris(8-hydroxy-quinoline)aluminum (Alq$_3$) material. This Schottky contact 23, to be referred as anode-contact or NPN-Schottky contact onwards, formation is equivalent to a P-N junction making the PNPN device. The external electric field 1 makes this contact 23 to be forward biased. The rest of assembly is identical as the NPN photo-amplifying and light emitting device with electron blocker 19 in FIG. 2. The P-type photosensitive organic semiconductor is made of TiOPc or specifically titanyl phthalocyanine, while the N-type emissive region 14 is made of Alq$_3$, which is a green light emitter. The electron blocker 19 is made up of N,N'-diphenyl-N-N'-bis(1-naphtyl)-1-1'biphenyl-4,4"diamine (NPB). When a light source (LASER) 10 is incident, upon the photosensitive region 6, it produces electron-hole pairs all over the region 6. Carriers, generated within the depletion region 3, and approximately one diffusion length from the depletion region in the P-type material 6 are pulled apart by the combined influence of the external electric field 1 and the internal electric field 8 at the reverse bias junction. This cumulative effect transports the holes in the form of a current 12 to the depletion region 7 where it may lower the barrier of the forward biased P-N junction. The electrons, however, travel in the opposite direction 13 towards the NPN-Schottky contact 23. This small electron current leads to a charge build-up at the NPN-Schottky contact 23. This charge accumulation will reduce the potential barrier for hole injection from the high work function metal anode. This barrier reduction allows the holes to be injected more easily from the anode, made of Indium tin oxide (ITO). The injected holes form a large current 24 that flows into the N-type emissive region 14. This current is an amplification whereby a small electron current 13, generated by the incident light source 10 under the influence of the external electric field 1 and the P-N junction field 8, results in a much larger hole current 24 into the N-type region 14 in the forward bias region 5. Meanwhile the electron blocker 19 blocks 20 the electrons 15, injected through the cathode due to the external electric field 1, from crossing the depletion region 7. This process facilitates the recombination of holes 24 which are flowing into the emitter region 14 and electrons 15 injected at the cathode contact by giving them time to recombine and emit light from the emissive region 14.

With reference to FIG. 20, by scanning the LASER 10 across the screen 34, we can generate and address all pixels 48 on the screen 34. With a million pixels and a frame period of 30 milliseconds, the LASER remains fixated on the pixel 48 for 30 nanoseconds before moving further. For the pixel 48 to continuously emit light for the whole frame period or more, there has to be a residual effect after the LASER leaves that pixel to move to another pixel. This residual effect ensures that the pixel remains lighted for the whole frame period or more, even after the LASER has left it. With reference to FIG. 3, the interval of time, starting when the LASER leaves the pixel and ending when the pixel stops emitting light, is determined by how long it takes for the electrons accumulated 13 at barrier potential, associated with the NPN-Schottky contact, to dissipate and reset the potential barrier height to its initial higher level as described before. As it is the requirement of the invention that the electrons 13 at or near the NPN-Schottky contact dissipate slowly, the objective is to increase this time. By increasing this time interval, as explained before, the light output of the pixel, in region 14, remains continuous till the end of the frame period or more.

In another embodiment, with reference to FIG. 4, we have an identical assembly as that of FIG. 3 with the difference that the N-type material on one side of NPN-Schottky contact 23 is a material M1 25 instead of the Alq$_3$. This material M1 has properties such that the dissipation of the accumulated charge, due to trapped photo-generated electrons, through recombination or transfer to the anode, takes longer than for other materials, such as the Alq$_3$ material, at or near the NPN-Schottky contact 23. This charge dissipation eventually resets the potential barrier to its original higher level at which holes are no more injected from the anode. When the LASER 10 strikes, the dissociation of the resulting exitons produce electron-hole charged pairs 11. The holes 12, under the combined influence of the external electric field 1 and the internal electric field on the depletion region 3, go towards the depletion region 7 at the forward bias P-N junction. The electrons 13 move toward and accumulate at the NPN-Schottky contact 23 due to the existing potential barrier. Once the electrons accumulate at the barrier, they lower the potential of the potential barrier 23 allowing the injection of more holes from the anode. The holes current 24 flow towards the emissive region 14 to emit light by recombining with electrons 15, being injected due to the external electric field 1, in region 14. The electrons 13 accumulating and lowering the potential barrier at the NPN-Schottky contact then start to dissipate through recombination or other mechanisms. Once all the accumulating electrons 13 are dissipated, the potential barrier 23 is restored to its original elevated level thereby stopping the hole current 24.

In another embodiment, with reference to FIG. 5, we have again, an identical assembly as that of FIG. 3 with the only difference that we have a thin layer 26 of the material M2 at the NPN-Schottky contact 23. This material M2 has properties such that they affect the time interval it takes for the electrons 13 to dissipate and restore the potential barrier to its initial higher level. This dissipation, once complete after the LASER leaves the pixel, effectively shuts off the hole current 24 to the region 14 thereby switching off the light emission from region 14. Therefore, as in a requirement of the invention, the time interval it takes for the completion of the dissipation process of electrons 13 at the NPN-Schottky contact, caused by the properties of material M2, is of a longer duration, than in case of the Alq$_3$ material. In such case, the pixel would remain at a continuous output of light from the emissive region 14, for a frame period or more.

In another embodiment, with reference to FIG. 6, we have an identical construct as that of FIG. 3 except that we replace the N-type material made of Alq$_3$ on one side of the NPN-Schottky contact 23 by a material M3 27 which provides an extra trap energy level 28 for electrons 13 coming from region 3. Likewise, as in the description of FIG. 3, the charge due to electrons 13 accumulating and lowering the potential barrier gradually starts to dissipate. Once all the charge dissipates, the potential barrier is restored to its original higher level thereby stopping the hole injection current 24 to flow into region 14 for emission of light. With the trap energy level 28, within the material M3, the electrons get trapped quickly and remain trapped for a longer period of time at or near the NPN-Schottky contact 23 allowing for an even more gradual and slow dissipation of the accumulated charge 13, than would be possible in a material without a trap as in the requirement of the invention. This trapping effect gives more time to restore the potential barrier's high potential and allows the hole current 24 to flow into the emissive region 14 for continuous light emission for one frame period or more.

In another embodiment, with reference to FIG. 7, we again have an identical construct as that of FIG. 3 except that we place a thin layer of material M4 29 at the NPN-Schottky contact which provides an extra band or a trap 30 for electrons 13 coming from region 3 in form of a photocurrent. Likewise, as in the description of FIG. 3, the electrical charge due to electrons 13 accumulating, and lowering the potential barrier, starts to dissipate. Once the charge due to the electron photocurrent 13, is dissipated, the barrier is restored to its original higher level. This stops the holes, from the high work function metal anode, to overcome the restored barrier and flow as the hole current 24 into region 14 for emission of light. With the trap 30, within the material M4, the electrons are trapped quickly and take a longer interval of time, as is the requirement of the invention, than is normal in a material without the trap to dissipate at or near the NPN-Schottky contact 23. Thus the trap 30 allows for an even more gradual and slow dissipation of the trapped photo-electrons giving more time, to fully restore the potential barrier 23 and allows the hole current 24 to flow into the emissive region 14 for an extended interval for continuous light emission for a frame period or more.

In another embodiment of the present invention, with reference to figures FIG. 3 to FIG. 7, the high work function metal forming the NPN-Schottky contact can be any high work function metal or P-type semiconductor. The NPN-Schottky junction will then be replaced by a P-N junction in case of a P-type semiconductor. The remaining assembly and operation for embodiments given by figures FIG. 3 to FIG. 7 would remain similar.

In another embodiment of the present invention, which may also be incorporated in the embodiments represented by figures starting from FIG. 1 up to FIG. 7, with reference to FIG. 7, the photosensitive region 6 is sensitive only to infrared light such as the one which is incident on region 6 due to LASER 10, the LASER 10 being only an infrared LASER. As the LASER 10 strikes the photosensitive region 6 charged electron-hole pairs 11 are produced all over region 6. Likewise, as in the description of embodiments depicted by figures FIG. 1 to FIG. 7, the production of the charged pairs 11 composed of electrons and holes subsequently leads to the emission of light from the emissive N-type region 14. In this embodiment, the N-type emitter 14 emits only visible light. The emission of only visible light from region 14 ensures that when the emitted visible light falls on the photosensitive region 6, it does not produce a feed back effect i.e. the incident visible light on region 6 from the emitter region 14, does not produce any charged electron-hole pairs in region 6. This is so, because the photosensitive region 6 is sensitive only to infrared light. As such, the production of charged electron-hole pairs 11 in region 6 is dependent only on the light due to the incident infrared LASER 10.

In another embodiment of the present invention, which may also be incorporated in the embodiments represented by figures starting from FIG. 1 up to FIG. 7, with reference to FIG. 8, the photosensitive region 6 is sensitive to the visible light in addition to light incident due to the infrared LASER 10. In this embodiment, the N-type emitter 14 emits only visible light. As the LASER 10 strikes the photosensitive region 6 charged electron-hole pairs 11 are produced all over region 6. Likewise, as in the description of embodiments depicted by figures FIG. 1 to FIG. 7, the production of the charged pairs 11 composed of electrons and holes subsequently leads to the emission of visible light 31 from the emissive N-type region 14. When the emitted visible light falls 32 on the photosensitive region 6, it produces a feed back effect i.e. the incident visible light 32 on photosensitive region 6, which is sensitive to the visible light from the emitter region 14, produces charged electron-hole pairs in region 6, in addition to the ones produced due to the incident LASER 10. This light absorption subsequently prolongs the emission of visible light 31 from region 14 till the end of the frame period when the electric field 1 is switched off to discontinue emission of light from the N-type emissive region 14. Thus the feedback loop, created due to the incident visible light 32 from the emissive region 14 on the photosensitive region 6, enables the pixel to be continuously lighted till the end of frame period or more.

In another embodiment of the present invention, with respect to FIG. 9, we have a photosensitive region 6 as being sensitive to visible light to produce a feedback effect, as previously described in another embodiment, and in addition we can also have a N-type material 33 in a reverse bias region 4 replacing the P-type material as the photosensitive region 6. In addition, in this embodiment, N-type emitter 14 emits only visible light. When the LASER 10 becomes incident on the N-type photosensitive material 33, charged electron-hole pairs are produced all over region 6. Within depletion region 3, in reverse bias region 4, and also approximately one diffusion length in addition to the depletion region in the N-type material 33, the charged electron-hole pairs 11 are pulled apart by the combined influence of external electric field 1 and internal electric field 8 at the reverse bias junction. This cumulative effect transports the holes in the form of a current 12 to the depletion region 7 where it may lower the barrier of the forward biased P-N junction. The electrons travel in the opposite direction 13 towards the NPN-Schottky contact 23. This small electron photocurrent accumulates at the interface and lowers the potential barrier height, which allows a large amount of holes to be injected at the high work function material anode. This enhancement of hole injection forms a large hole current 24 to flow into the N-type emissive region 14. This leads up to the emission of visible light 31 from the N-type emissive region 14 as described in previous embodiments. The visible light being emitted 31 from the region 14 becomes incident 32 on the photosensitive N-type region 6 and produces the feed back loop, as described in a pervious embodiment, which allows the pixel to remain continuously lighted till the length of the frame period when the electric field 1 is switched off to discontinue emission of light from N-type emissive region 14.

In another embodiment of the present invention, with respect to FIG. 10, FIG. 11 and FIG. 20, we have the photosensitive region 6 as being also sensitive to visible light to produce a feedback effect, as previously described in another embodiment, and in addition, we have a filter 35, which allows only a select narrow band of frequencies of visible light to pass through it. This band is included in the band of frequencies of visible light being emitted by pixel at the N-type emissive region 14. In addition, in this embodiment the N-type emitter 14 emits only visible light. The filter 35 is placed in a position such that it shields the photosensitive region 6, which could either be a P-type or a N-type as described in previous embodiments, to avoid a feedback effect due to ambient light coming from the direction of display screen 34 (FIG. 20). As the LASER 10 strikes the photosensitive region 6, the N-type emissive region 6 emits visible light 31 subsequently, as described in the previous embodiments. The filter 35 allows the visible light being emitted 31, by the pixel from N-type emissive region 14, to pass through, except the visible light coming from the pixel that is composed of frequencies not passable through the filter 35, and become incident 32 on the photosensitive region 6 and produce the feedback loop. The feedback effect allows the generation of charged electron-hole pairs to be produced in region 6 and thereby subsequently allowing the pixel, as described in the previous embodiments, to continue to emit light till the end of the frame period when the electric field 1 is switched off. The filter 35 does not inhibit the path of the LASER 10 incident on the photosensitive region 6.

In another embodiment of the invention in a case of a PNP photo-amplifying and light-emitting device 36, with reference to FIG. 12, there is a photosensitive region 6, not available in a normal device. Also included in the assembly is a contact made from a low work function metal 40, such as Aluminum, which forms a Schottky contact 41, to be referred as cathode-contact or PNP-Schottky contact onwards, with the P-type semiconductor, composed of P-type material P2 or P2 with an additional material P1 for a specific purpose to be explained shortly. The P-type semiconductor at the forward bias region 5 is composed of material P3. When a light source (LASER) 10 is incident, upon the photosensitive region 6, it produces electron-hole pairs all over the region 6. Carriers, within the depletion region 3, in the reverse bias region 4, and also approximately one diffusion length from the depletion region are pulled apart by the combined influence of the external electric field 1 and the internal electric field 8 at the reverse bias junction 3. As such, the electrons are pulled and directed to go towards the N-type region 37, and the holes 38 get transported as a small current, which is proportional to the intensity of the incident light source 10, to get accumulated at the PNP-Schottky junction 41. This accumulation of holes, at the PNP-Schottky junction, reduces the potential barrier 41. The lowering of the potential barrier 41 by the small hole current 38, allows relatively a very large electron current 39 to flow due to the injected electrons 15, from the contact metal 40. Once this potential barrier 41 is lowered, these electrons 39, form a very large current as compared to the small hole current 38 generated by the incident light source 10 in the photosensitive region 6, and flow into the N-type region 14. This large electron current 39 is an amplification whereby a small hole current 38 generated by the incident light source 10 under the influence of the external electric field 1 and the P-N junction field 8, results in a much larger electron current 39. The electron current 39 goes into what constitutes the emissive layer of the device, composed of N-type organic semiconductor tris(8-hydroxy-quinoline)aluminum ($Alq_3$) material, called N-type emitter region 14. The electrons 39 arriving into the N-type region 14 recombine with holes 16 injected at the anode contact, made of ITO material 22 or Indium Tin Oxide, due to the external electric field 1. The ITO 22 is an efficient hole injector. This recombination, taking place in N-type emissive region 14, results in the emission of light.

The embodiment in FIG. 12 represents, with reference to FIG. 21, the functioning of a pixel in a display screen 34. Light is emitted 49 from the screen 34 only from the areas illuminated by the laser creating the equivalent of an addressed pixel 50. By scanning the LASER 10 across the screen 34, we can generate and address a million pixels 50 on the screen. With a frame period of 30 milliseconds, the LASER remains fixated on the pixel 50 for 30 nanoseconds before moving further. If the pixel 50 were to continuously emit light for the whole frame period or more, there has to be a residual effect after the LASER leaves that pixel to move to another pixel. This residual effect ensures that the pixel remains lighted for the whole frame period or more, even after the LASER has left it. With reference to FIG. 12, the interval of time, starting when the LASER leaves the pixel and ending when the pixel stops emitting light, is determined by how long it takes for the holes 38 at the PNP-Schottky contact 41 to dissipate and reset the barrier potential to its initial higher level as described before. As it is the requirement of the invention that the holes 38 accumulated at the Schottky contact dissipate more slowly, the objective is to increase this time. Keeping the requirement of the invention in view and therefore to add more time to the interval, in which the holes 38 dissipate and thereby reset the barrier to its initial higher level, we add the P1 P-type semiconductor along with P2 type material. The properties of P1 material allow for a slower dissipation of holes 38, at or near the Schottky contact, as it is required by the invention. By increasing the time interval, for the charge dissipation, the light output of the pixel, in region 14, remains continuous till the end of the frame period or more.

With reference to FIG. 13, we have a PNP photo-amplifying and light-emitting device with an additional material which functions like a hole-blocker 21. Here we have, initially, an identical process taking place as in the case of FIG. 12 NPNP photo-amplifying and light-emitting device i.e. the process in which the incident light source 10 strikes the photosensitive region 6 and from the resulting charged electron-hole pairs in the region 6 the ones 11 near the reverse bias depletion region 3 gives rise to the small hole current 38 which in turn allows the accumulation of holes at the PNP-Schottky contact 41. There again it follows the same sequence of events whereby the accumulation of holes due to the small hole current 38 lowers the potential at the PNP-Schottky contact 41 and allows the injection of electrons from the contact metal 40 to flow in form of a much larger electron current 39 into the N-type region 14. Thus, the larger electron current 39 resulting from the incident light source (LASER) 10 at region 6 goes into N-type emitter region 14. The holes 16 coming into the region 14 due to the external electric field 1 are blocked by the hole-blocker 21. This process allows holes to accumulate in region 14 and facilitate the subsequent recombination process. Electrons 39 and holes 16 then recombine allowing for light emission from the emissive N-type region 14.

In another embodiment, with reference to FIG. 14, we have an identical construct as that of FIG. 13 except that we replace the P-type material composed of material P2 or material P2 along with material P1 on one side of the Schottky barrier by a material P4 44 which provides an extra trap energy level 45 for holes 38 coming in form of a current. Likewise, as in the description of FIG. 13, electrical charge due to the holes 38, accumulating and lowering the potential barrier, gradually starts to dissipate. Once all the charge dissipates, the potential barrier at the Schottky contact is restored to its original higher level thereby stopping the electron injection current 39 to flow into region 14 for emission of light. With the trap energy level 45, within the material P4, the holes get trapped quickly and take longer to dissipate at or near the Schottky contact, as is the requirement of the invention. Thus, the trap energy level 45 allows for an even more gradual and slow dissipation of accumulating holes 38, than would be possible in a material without a trap energy level, adding more time to restore the potential barrier and allows the electron current 39 to be injected and to flow into the emissive region 14 for continued light emission for an interval of a frame period or more.

In another embodiment, with reference to FIG. 15, we again have an identical construct as that of FIG. 13 except that we place a thin layer of material P5 46 at the Schottky contact which provides an extra trap level 47 for holes 38 coming in form of a photo-current. Likewise, as in the description of FIG. 13, the holes 38 accumulating and lowering the potential barrier start to dissipate. Once all the accumulated charge dissipates at or near the Schottky contact, the barrier potential is restored to its original higher level. This stops the injection of electrons, from the low work function metal contact, to overcome the restored potential barrier and flow as the electron current 39 into region 14 for emission of light. With the trap energy level 47, within the material P5, the holes 38 get trapped quickly and take a longer interval of time, as in the requirement of the invention, than is normal in a material without the trap to dissipate at the Schottky contact. Thus, the trap energy level 47 allows for an even more gradual and slow dissipation of holes giving more time to fully restore the potential barrier and allow the injected electron current 39 to flow into the emissive region 14 for an extended interval for continued light emission for an interval of a frame period or more.

In another embodiment of the present invention, with reference to figures FIG. 12 to FIG. 15, the low work function metal forming the PNP-Schottky contact can be any low work function metal or a N-type semiconductor. The PNP-Schottky contact will then be replaced by a P-N junction in case of a N-type semiconductor. The remaining assembly and operation for embodiments given by figures FIG. 12 to FIG. 15 would remain similar.

In another embodiment of the present invention, which may also be incorporated in the embodiments represented by figures starting from FIG. 12 up to FIG. 15, with reference to FIG. 15, the photosensitive region 6 is sensitive only to infrared light such as the one which is incident on region 6 due to LASER 10, the LASER 10 being only an infrared LASER. As the LASER 10 strikes the photosensitive region 6 charged electron-hole pairs 11 are produced all over region 6. Likewise, as in the description of embodiments depicted by figures FIG. 12 to FIG. 15, the production of the charged pairs 11 composed of electrons and holes subsequently leads to the emission of light from the emissive N-type region 14. In this embodiment, the N-type emitter 14 emits only visible light. The emission of only visible light from region 14 ensures that when the emitted visible light falls on the photosensitive region 6, it does not produce a feed back effect i.e. the incident visible light on region 6 from the emitter region 14, does not produce any charged electron-hole pairs in region 6. This is so, because the photosensitive region 6 is sensitive only to infrared light. As such, the production of charged electron-hole pairs 11 in region 6 is dependent only on the light due to the incident infrared LASER 10.

In another embodiment of the present invention, which may also be incorporated in the embodiments represented by figures starting from FIG. 12 up to FIG. 15, with reference to FIG. 16, the photosensitive region 6 is sensitive to the visible light in addition to light incident on region 6 due to LASER 10. In this embodiment, the N-type emitter 14 emits only visible light. As the LASER 10 strikes the photosensitive region 6 charged electron-hole pairs 11 are produced all over region 6. Likewise, as in the description of embodiments depicted by figures FIG. 12 to FIG. 15, the production of the charged pairs 11 composed of electrons and holes subsequently leads to the emission of visible light 31 from the emissive N-type region 14. When the emitted visible light falls 32 on the photosensitive region 6, it produces a feed back effect i.e. the incident visible light 32 on photosensitive region 6, which is sensitive to the visible light, from the emitter region 14 produces charged electron-hole pairs in region 6, in addition to the ones produced due to the incident LASER 10. This light absorption subsequently prolongs the emission of visible light 31 from region 14 till the end of the frame period when the electric field 1 is switched off to discontinue emission of light from the N-type emissive region 14. Thus the feedback loop, created due to the incident visible light 32 from the emissive region 14 on the photosensitive region 6, enables the pixel to be continuously lighted till the end of frame period or more.

In another embodiment of the present invention, with respect to FIG. 17, we have a photosensitive region 6 composed of an additional N-type material 33 alongside with the N-type $Alq_3$ emitter in a reverse bias region 4 forming a reverse biased P-N junction 3 with the P-type material. Thus, the N-type material 33 replaces the P-type material as the photosensitive region 6. In addition, we have the photosensitive region 6 as being sensitive to visible light to produce a feedback effect, as previously described in another embodiment. Further, in this embodiment the N-type emitter 14 emits only visible light. When the LASER 10 becomes incident on the N-type photosensitive material 33, charged electron-hole pairs are produced all over region 6. Within depletion region 3, in reverse bias region 4, and also approximately one diffusion length in addition to the depletion region in the N-type material 33, the charged electron-hole pairs 11 are pulled apart by the combined influence of external electric field 1 and internal electric field 8 at the reverse bias junction. This cumulative effect transports the electrons in the form of a current 37 to the depletion region 7 where it may lower the barrier of the forward biased P-N junction. The holes, however, travel in the opposite direction 38 towards the PNP-Schottky contact 41. This small hole current accumulates holes at the interface and lowers the potential barrier height, which allows the injection of electrons from the low work function material. These electrons form a large current 39 that flows into the N-type emissive region 14. This leads up to the emission of visible light 31 from the N-type emissive region 14 as described in previous embodiments. The visible light being emitted 31 from the region 14 becomes incident 32 on the photosensitive N-type region 6 and produces the feed back loop, as described in a pervious embodiment, which allows the pixel to remain continuously lighted till the length of the frame period when the electric field 1 is switched off to discontinue emission of light from N-type emissive region 14.

In another embodiment of the PNP assembly, with respect to FIG. 18, FIG. 19 and FIG. 21, we have the photosensitive region 6 as being also sensitive to visible light to produce a feedback effect, as previously described in another embodiment, and in addition, we have a filter 35, which allows only a select narrow band of frequencies of visible light to pass through it. This band is included in the band of frequencies of visible light being emitted by pixel at the N-type emissive region 14. In addition, in this embodiment the N-type emitter 14 emits only visible light. The filter 35 is placed in a position such that it shields the photosensitive region 6, which could either be a P-type or a N-type as described in previous embodiments, to avoid a feedback effect due to ambient light coming from the direction of display screen 34 (FIG. 21). As the LASER 10 strikes the photosensitive region 6, the N-type emissive region 6 emits visible light 31 subsequently, as described in the previous embodiments. The filter 35 allows the visible light being emitted 31, by the pixel from N-type emissive region 14, to pass through, except the visible light coming from the pixel that is composed of frequencies not passable through the filter 35, and become incident 32 on the photosensitive region 6 and produce the feedback loop. The feedback effect allows the generation of charged electron-hole pairs to be produced in region 6 and thereby subsequently allowing the pixel, as described in the previous embodiments, to continue to emit light till the end of the frame period when the electric field 1 is switched off. The filter 35 does not inhibit the path of the LASER 10 incident on the photosensitive region 6.

DRAWING LEGEND

1. External electric field
2. NPN device
3. Reverse bias depletion region
4. Reverse bias region
5. Forward bias region
6. P-type photosensitive region
7. Forward bias depletion region
8. Electric field in the depletion region 3
9. Electric field in the depletion region 7
10. Incident light source (LASER)
11. Charged pair production
12. Small hole current towards P-type region
13. Electron current towards N-type region
14. N-type $Alq_3$ light emission region
15. Cathode injected electrons
16. Anode injected holes
17. Larger hole current going through the lowered barrier
18. Replenishing of holes
19. Electron blocker barrier
20. Electrons getting blocked
21. Hole blocker
22. Indium Tin Oxide (ITO) metal
23. NPN-Schottky contact
24. Larger hole current towards N-type emissive region
25. N-type material M1 instead of $Alq_3$
26. Thin layer of N-type material M2
27. N-type material M3 having a trap energy level for electrons
28. Trap energy level for electrons in N-type material M3
29. Thin layer of material M4 with a trap energy level for electrons
30. Trap energy level for electrons in thin layer of material M4
31. Emission of visible light
32. Emitted visible light becoming incident on photosensitive region
33. N-type photosensitive region
34. Display screen
35. Filter allowing only a narrow band of frequencies of visible light
36. PNP device
37. Small electron current towards N-type region
38. Hole current towards PNP-Schottky contact region
39. Larger electron current going through lowered barrier
40. Low work function metal Aluminum
41. PNP-Schottky contact
42. P-type material P2

43. P-type material P1
44. P-type material P4 with a trap energy level for holes
45. Hole trap energy level for P4 material
46. Thin layer of P-type P5 material
47. Hole trap energy level for P5 material
48. Part of NPN device as a pixel
49. Emission of light
50. Part of PNP device as a pixel

What is claimed:

1. A monolithic display device comprising a N-type light emitting material beside a cathode, carrier blocking layer after the light-emitting layer, a P-type light-sensing material after the carrier blocking layer and a N-type material after the light-sensing material.

2. A display device as in claim 1 wherein an anode-contact is an efficient hole injector.

3. A display device as in claim 1 wherein an anode-contact is an efficient hole injector made on Indium Tin Oxide.

4. A display device as in claim 1 wherein the light sensing area is made of P-type organic semiconductor.

5. A display device as in claim 1 such that there is a N-type type light emitting material is beside a cathode, carrier blocking layer after the light-emitting layer, a P-type light-sensing material after the carrier blocking layer such that a N-type material after the light-sensing material forms a potential barrier at an anode contact with the device.

6. A display device as in claim 5 wherein the N-type area adjacent to the anode-contact is made of N-type organic semiconductor made of tris (8-hydroxy-quinoline)aluminium ($Alq_3$) material.

7. A display device as in claim 5 wherein an incident laser on the light-sensing area causes a charge build-up on the anode-contact; wherein the N-type material adjacent to the anode-contact is made of such a material that it takes longer for the charge to dissipate than in case of $Alq_3$ material such that a pixel in a display screen remains lighted for a frame period or more.

8. A display device as in claim 5 wherein an incident laser on the light-sensing area causes a charge build-up on the anode-contact; wherein there is a thin layer of material at the anode-contact such that it takes longer for the charge to dissipate such that a pixel in a display screen remains lighted for a frame period or more.

9. A display device as in claim 5 wherein an incident laser on the light-sensing area causes a charge build-up on the anode-contact; wherein the N-type material adjacent to the anode-contact has a trap energy level for trapping dissipating charges because of which it takes longer for the charge to dissipate at the anode-contact such that a pixel in a display screen remains lighted for a frame period or more.

10. A display device as in claim 5 wherein an incident laser on the light-sensing area causes a charge build-up on the anode-contact; wherein there is a thin layer of a material, at the anode-contact, having a trap energy level for trapping dissipating charges because of which it takes longer for the charge to dissipate at the anode-contact such that a pixel in a display screen remains lighted for a frame period or more.

11. A display device as in claim 5 wherein the anode-contact is made up of a high work function metal and the potential barrier at the anode is a Schottky junction.

12. A display device as in claim 5, wherein the light-sensing area is sensitive to infrared light only and the light-emitting area emits visible light only.

13. A display device as in claim 5 wherein the light-sensing area is sensitive to infrared and visible light and the light-emitting area emits visible light such that a feedback effect can take place to enhance interval of light emission.

14. A display device as in claim 5 wherein the carrier blocking material is made up of N,N'-diphenyl-N-N'-bis(1-naphtyl)-1-1'biphenyl-4,4"diamine (NPB) material.

15. A display device as in claim 5 wherein the light sensing area is made up of titanyl phthalocyanine (TiOPc) material.

16. A display device such as in claim 1 such that the N-type light-emitting material is beside the cathode, carrier blocking layer after the light-emitting layer, a P-type material after the carrier blocking layer and a N-type light-sensing material, after the P-type material, forming a potential barrier at an anode-contact with the device.

17. A display device such as in claim 16 wherein the light-sensing area is sensitive to visible light and the light-emitting area emits visible light such that a feedback effect can take place to enhance interval of light emission.

18. A display device such as in claim 5 wherein the light-sensing area is sensitive to visible light and the light-emitting area emits visible light such that there is a filter, obstructing ambient light, and allowing only a narrow band of visible light frequencies, including frequencies emitted by the light-emitting area, to pass through for a feedback effect.

19. A display device as in claim 5, wherein a pixel in a display screen remains lighted for a frame period or more due to a residual effect.

20. A monolithic display device comprising a first P-type light sensing material is beside a cathode, carrier blocking layer after the light-sensing material, a N-type light-emitting material after the carrier blocking layer and a second P-type material after the light-emitting material.

21. A display device as in claim 20 wherein the P-type light sensing material forms a potential barrier at the cathode-contact.

22. A display device as in claim 20 such that a first P-type layer consists of two different P-type materials adjacent to each other, wherein the one away from the cathode is a light-sensing material, a carrier blocking layer after the light-sensing material, a N-type light-emitting material after the carrier blocking layer and a P-type material after the light-emitting material; wherein the P-type material, adjacent the light-sensing material, forms a potential barrier at the cathode-contact.

23. A display device as in claim 20 wherein the cathode-contact is made up low work function metal and the potential barrier at the cathode-contact is a Schottky junction.

24. A display device as in claim 13 such that of the two P-type materials side by side, the one adjacent to the cathode slows dissipation of a charge build-up at the cathode caused by an incident laser on the light-sensing region.

25. A display device as in claim 20 wherein a contact at anode adjacent to the second P-type material is made on Indium Tin Oxide.

26. A display device as in claim 20 wherein the carrier blocking material is a hole blocker.

27. A display device as in claim 20 wherein the N-type light-emitting area is made of N-type organic semiconductor made of tris(8-hydroxy-quinoline)aluminium ($Alq_3$) material.

28. A display device as in claim 20 wherein an incident laser on the light-sensing area causes a charge build-up on the cathode-contact; wherein the P-type material adjacent to the cathode-contact has a trap energy level for trapping dissipating charges because of which it takes longer for the charge to dissipate at the cathode-contact such that a pixel in a display screen remains lighted for a frame period or more.

29. A display device as in claim 20 wherein an incident laser on the light-sensing area causes a charge build-up on the cathode-contact; wherein there is a thin layer of material, at the cathode contact, having a trap energy level for trapping dissipating charges because of which it takes longer for the charge to dissipate at the cathode-contact such that a pixel in a display screen remains lighted for a frame period or more.

30. A display device as in claim 20 wherein the light-sensing area is made of P-type organic semiconductor.

31. A display device as in claim 20 wherein the light-sensing area is made is sensitive to infrared light only and the light-emitting area emits visible light only.

32. A display device as in claim 20 wherein the light-sensing area is sensitive to infrared and visible light and the light-emitting area emits visible light such that a feedback effect can take place to enhance interval of light emission.

33. A display device as in claim 20 such that a first P-type material is beside the cathode, a N-type light-sensing material after the first P-type material, a carrier blocking layer after the light-sensing material, a N-type light-emitting material after the carrier blocking layer and a second P-type material after the light-emitting material; wherein the P-type material forms a potential barrier at an cathode-contact.

34. A display device as in claim 33 wherein the light-sensing area is sensitive to visible light and the light-emitting area emits visible light such that a feedback effect can take place to enhance interval of light emission.

35. A display device such as in claim 20 wherein the light-sensing area is sensitive to visible light and the light-emitting area emits visible light such that there is a filter, obstructing ambient light, and allowing only a narrow band of visible light frequencies, including frequencies emitted by the light-emitting area, to pass through for a feedback effect.

36. A display device as in claim 20, wherein a pixel in a display screen remains lighted for a frame period or more due to a residual effect.

* * * * *